United States Patent
Cheng et al.

(10) Patent No.: US 11,018,240 B2
(45) Date of Patent: *May 25, 2021

(54) VERTICAL FIELD EFFECT TRANSISTOR WITH REDUCED PARASITIC CAPACITANCE

(71) Applicant: International Business Machines Corporation, Armonk, NY (US)

(72) Inventors: Kangguo Cheng, Schenectady, NY (US); Ruilong Xie, Schenectady, NY (US); Tenko Yamashita, Schenectady, NY (US); Chun-Chen Yeh, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/732,463

(22) Filed: Jan. 2, 2020

(65) Prior Publication Data
US 2020/0135884 A1    Apr. 30, 2020

Related U.S. Application Data

(63) Continuation of application No. 16/018,379, filed on Jun. 26, 2018, now Pat. No. 10,566,442, which is a
(Continued)

(51) Int. Cl.
*H01L 29/66* (2006.01)
*H01L 21/8234* (2006.01)
(Continued)

(52) U.S. Cl.
CPC .. *H01L 29/6653* (2013.01); *H01L 21/823487* (2013.01); *H01L 27/088* (2013.01);
(Continued)

(58) Field of Classification Search
CPC .............. H01L 21/845; H01L 27/0886; H01L 27/0924; H01L 27/10826; H01L 27/10879; H01L 27/1211; H01L 29/41791
See application file for complete search history.

(56) References Cited

U.S. PATENT DOCUMENTS

| 7,071,048 B2 | 7/2006 | Son et al. |
| 7,812,411 B2 | 10/2010 | Cheng |

(Continued)

FOREIGN PATENT DOCUMENTS

CN    201069775 Y    6/2008

OTHER PUBLICATIONS

Anonymous "Method for Fabricating a Vertical FET with Air-Gap Top Spacer" Disclosed Anonymously, IP.com; IPCOM000245671D; Mar. 28, 2016, 6 pages.
(Continued)

*Primary Examiner* — Zandra V Smith
*Assistant Examiner* — Andre C Stevenson
(74) *Attorney, Agent, or Firm* — Cantor Colburn LLP; Joseph Petrokaitis

(57) ABSTRACT

Embodiments are directed to a method and resulting structures for a semiconductor device having reduced parasitic capacitance. A semiconductor fin is formed on a substrate. A first bottom spacer is formed on a surface of the substrate and a sidewall of the semiconductor fin. A sacrificial spacer is formed over a channel region of the semiconductor fin and a portion of the first bottom spacer. A second bottom spacer is formed on a surface of the first bottom spacer and adjacent to the sacrificial spacer. The sacrificial spacer is removed and a conductive gate is formed over the channel region of the semiconductor fin.

13 Claims, 28 Drawing Sheets

Related U.S. Application Data continuation of application No. 15/479,567, filed on Apr. 5, 2017, now Pat. No. 10,096,692.

(51) Int. Cl.
  *H01L 27/088* (2006.01)
  *H01L 29/423* (2006.01)
  *H01L 29/786* (2006.01)
  *H01L 29/78* (2006.01)

(52) U.S. Cl.
  CPC .. *H01L 29/42392* (2013.01); *H01L 29/66553* (2013.01); *H01L 29/66666* (2013.01); *H01L 29/7827* (2013.01); *H01L 29/78642* (2013.01); *H01L 29/66545* (2013.01)

(56) References Cited

U.S. PATENT DOCUMENTS

| | | | |
|---|---|---|---|
| 8,637,849 B2 | 1/2014 | Deligiani et al. | |
| 8,802,513 B2 | 8/2014 | Reznicek et al. | |
| 9,029,218 B2 | 5/2015 | Loh et al. | |
| 9,142,660 B2 | 9/2015 | Guo et al. | |
| 9,368,572 B1 | 6/2016 | Cheng et al. | |
| 9,704,990 B1 | 7/2017 | Mochizuki et al. | |
| 10,096,692 B1 * | 10/2018 | Cheng | H01L 29/42392 |
| 10,566,442 B2 * | 2/2020 | Cheng | H01L 21/823487 |
| 2014/0191321 A1 | 7/2014 | Cheng et al. | |
| 2015/0084063 A1 | 3/2015 | Van Brunt et al. | |
| 2015/0221648 A1 | 8/2015 | Gimbert | |
| 2017/0062325 A1 | 3/2017 | Greene | |
| 2017/0117365 A1 | 4/2017 | Bu et al. | |
| 2018/0294340 A1 | 10/2018 | Cheng et al. | |
| 2018/0301541 A1 | 10/2018 | Cheng | |

OTHER PUBLICATIONS

Kudo, T. Takano, H. Yamauchi, M. Iizuka, M. Nakamura. "High-Speed Operation of Step-Edge Vertical-Channel Organic Transistors," Extended Abstracts of the 2009 International Conference on Solid State Devices and Materials, Sendai, 2009, pp. 843-844.

List of IBM Patents or Patent Applications Treated As Related; Date Filed: Jan. 2, 2020; 2 pages.

V. D. Kunz; T. Uchino; C. H. de Groot; P. Ashburn; D. C. Donaghy; S. Hall; Yun Wang; P. L. F. Hemment. "Reduction of Parasitic Capacitance in Vertical MOSFETs by Spacer Local Oxidation,"IEEE Transactions on Electron Devices, vol. 50, No. 6, Jun. 2003; pp. 1487-1493.

\* cited by examiner

US 11,018,240 B2

VERTICAL FIELD EFFECT TRANSISTOR WITH REDUCED PARASITIC CAPACITANCE

DOMESTIC PRIORITY

This application is a continuation of U.S. application Ser. No. 16/018,379, entitled "VERTICAL FIELD EFFECT TRANSISTOR WITH REDUCED PARASITIC CAPACITANCE," filed Jun. 26, 2018, which is a continuation of U.S. application Ser. No. 15/479,567, titled "VERTICAL FIELD EFFECT TRANSISTOR WITH REDUCED PARASITIC CAPACITANCE" filed Apr. 5, 2017 (now U.S. Pat. No. 10,096,692, issued Oct. 9, 2018) the contents of which are incorporated by reference herein in their entireties.

BACKGROUND

The present invention generally relates to fabrication methods and resulting structures for semiconductor devices. More specifically, the present invention relates to vertical FETs with reduced parasitic capacitance.

In contemporary semiconductor device fabrication processes, a large number of semiconductor devices, such as field effect transistors (FETs), are fabricated on a single wafer. Some non-planar transistor architectures, such as vertical field effect transistors (VFETs), employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

SUMMARY

Embodiments of the present invention are directed to a method for fabricating a semiconductor device. A non-limiting example of the method includes forming a semiconductor fin on a substrate. A first bottom spacer is then formed on a surface of the substrate and a sidewall of the semiconductor fin. A sacrificial spacer is formed over a channel region of the semiconductor fin and a portion of the first bottom spacer. A second bottom spacer is formed on a surface of the first bottom spacer and adjacent to the sacrificial spacer. The sacrificial spacer is removed and a conductive gate is formed over the channel region of the semiconductor fin.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
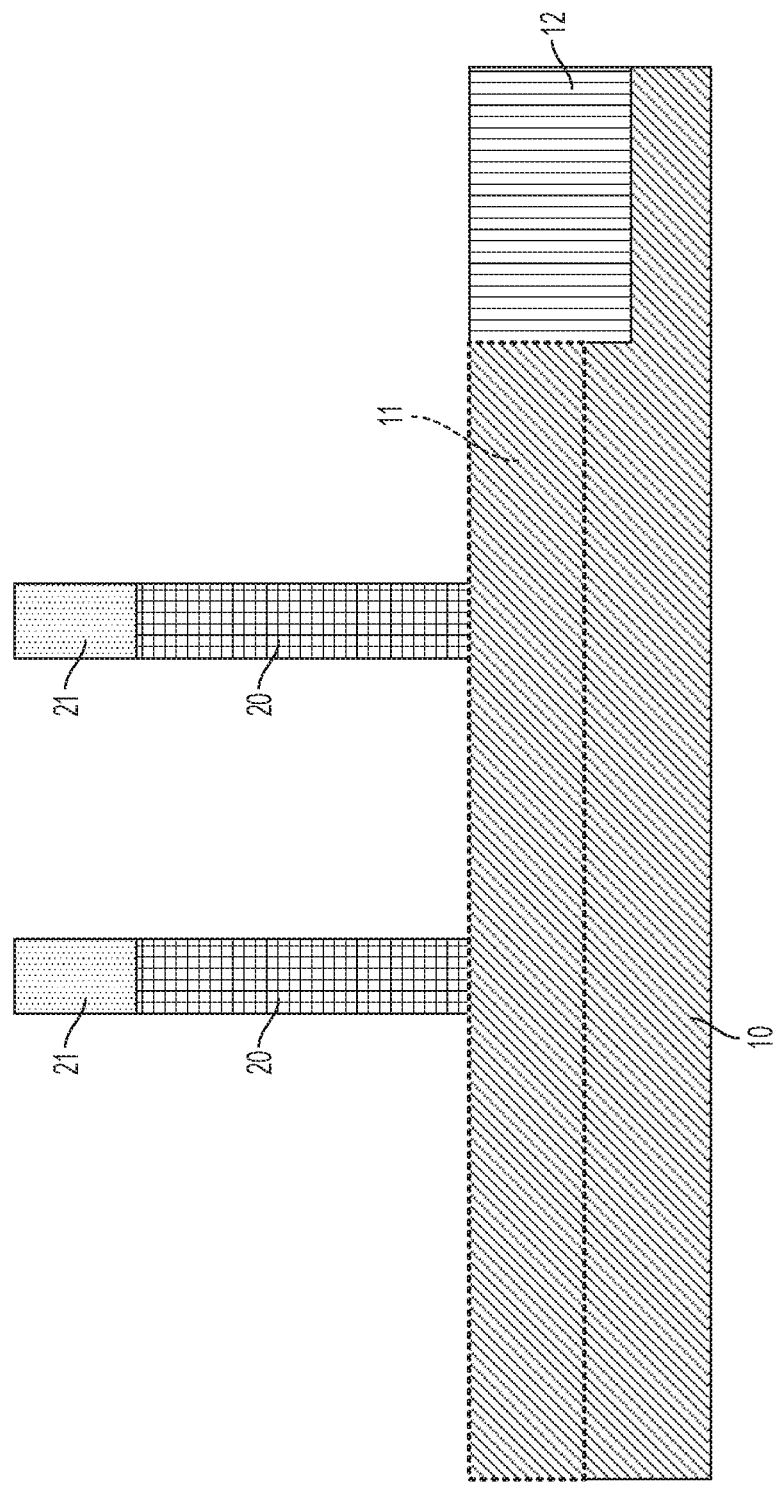
FIG. 1 depicts a cross-sectional view of a semiconductor structure after a processing operation according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, some non-planar transistor device architectures, such as VFETs, employ semiconductor fins and side-gates that can be contacted outside the active region, resulting in increased device density over lateral devices. There are challenges, however, in providing VFETs with equal or superior performance characteristics to lateral devices. In a VFET the contact to the bottom source/drain (S/D) is formed from the top of the structure such that the bottom S/D contact overlaps the gate. This vertically stacked configuration in combination with the reduced footprint of VFETs results in a large parasitic capacitance between the gate and the S/D region of the substrate. Parasitic capacitance between two conductors (also known as conductor-to-conductor capacitance) is a function of the length and thickness of the conductors as well as the distance separating the conductors. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. Unfortunately, parasitic capacitance continues to increase as device dimensions and component spacing shrinks to meet increasing demands for smaller electronic devices. Conventional approaches to reducing the parasitic capacitance between the gate and the S/D region of the VFET substrate have not been wholly successful. In a conventional VFET, for example, a thin bottom spacer is formed between the gate and the bottom S/D region to somewhat mitigate the parasitic capacitance. The thickness of this thin bottom spacer in conventional VFETs, however, is constrained by channel length requirements. Consequently, the parasitic capacitance remains relatively high, and better solutions are needed.

Turning now to an overview of aspects of the present invention, one or more embodiments of the invention provide methods and structures configured to reduce parasitic capacitance in a VFET. A thin bottom spacer is first formed over the bottom S/D region according to conventional processes. A sacrificial spacer is then formed over the thin bottom spacer in a channel region of the VFET (i.e., the sacrificial spacer is disposed on one or more sidewalls of the vertical fin). The thickness of portions of the spacers in non-channel regions of the VFET, e.g., those regions not under the sacrificial spacer, is increased. Increasing the thickness of the spacers in these non-channel regions increases the distance separating portions of the gate in the non-channel regions from the bottom S/D region. As mentioned previously, parasitic capacitance is a partial function of the distance separating the conductors. Consequently, increasing the thickness of the spacers decreases the parasitic capacitance between the gate and bottom S/D region.

Methods for forming a semiconductor device and semiconductor devices in accordance with embodiments of the invention are described in detail below by referring to the accompanying drawings in FIGS. 1-28.

FIG. 1 depicts a cross-sectional view of a VFET structure formed on a substrate during an intermediate operation of a method of fabricating a semiconductor device according to one or more embodiments of the invention. As depicted in FIG. 1, a partially fabricated semiconductor device can include one or more vertical semiconductor fins 20 (hereinafter semiconductor fins 20) formed on a heavily doped region 11 of a substrate 10. Each of the semiconductor fins 20 can have a height ranging from 1 nm to 150 nm, for example, from 10 nm to 50 nm. Each of the semiconductor fins 20 can have a width ranging from 5 nm to 40 nm, for example, from 10 nm to 20 nm. Adjacent semiconductor fins 20 can be separated by a pitch ranging from 20 nm to 100 nm, for example, from 30 nm to 50 nm.

The substrate 10 can be any suitable substrate material, such as, for example, monocrystalline Si, SiGe, SiC, III-V compound semiconductor, II-VI compound semiconductor, or semiconductor-on-insulator (SOI). In some embodiments, the substrate 10 includes a buried oxide layer (not depicted). The semiconductor fins 20 can be electrically isolated from other regions of the substrate 10 by a shallow trench isolation (STI) 12. The STI 12 can be of any suitable dielectric material, such as, for example, a silicon oxide. Any known manner of forming the STI 12 can be utilized. In some embodiments, the STI 12 is formed by etching back the substrate 10 to form a trench, filling the trench with the STI 12 material, and planarizing to a surface of the substrate 10 using, for example, a CMP process.

The heavily doped region 11 of the substrate can be a source or drain region formed in the substrate 10 by a variety of methods, such as, for example, in-situ doped epitaxy, doped following the epitaxy, or by implantation and plasma doping. The heavily doped region 11 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments, the heavily doped region 11 includes epitaxial semiconductor materials grown from gaseous or liquid precursors. In some embodiments, epitaxial regions are epitaxially grown over the substrate 10. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., Ga, B, $BF_2$, or Al). The dopant concentration in the doped regions can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions include silicon. In some embodiments, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

A hard mask 21 is formed on a surface of each of the semiconductor fins 20. The hard mask 21 can include an oxide, nitride, oxynitride or any combination thereof, including multilayers. In some embodiments, the hard mask 21 can include silicon oxide or silicon nitride. The hard mask 21 can be formed utilizing a deposition process such as, for example, chemical vapor deposition (CVD), plasma enhanced chemical vapor deposition (PECVD), chemical solution deposition, evaporation. In some embodiments, the hard mask 21 can be formed by a thermal process such as, for example, oxidation or nitridation of the top semiconductor layer. Any combination of the above mentioned processes can also be used in forming the hard mask 21. The hard mask 21 can have a thickness from 20 nm to 80 nm, for example, from 30 nm to 60 nm.

In some embodiments, the hard mask 21 is formed prior to the semiconductor fins 20. The hard mask 21 is then patterned and the pattern is transferred to the substrate 10 to form the semiconductor fins 20 using known lithographic processes. The lithographic step can include applying a photoresist layer (not depicted) atop the hard mask 21, exposing the photoresist layer to a desired pattern of radiation, and developing the exposed photoresist layer utilizing a resist developer. The etching process can include dry etching and/or wet chemical etching. Examples of dry etching processes that can be used include reactive ion etching (RIE), ion beam etching, plasma etching or laser ablation. The etching process can transfer the pattern from the patterned photoresist layer to the hard mask 21 and to the substrate 10. In some embodiments, a buried insulator layer (not depicted) serves as an etch stop. After forming the semiconductor fins 20, the patterned photoresist layer can be removed utilizing a resist stripping process such as, for example, ashing. In some embodiments, the semiconductor fins 20 are formed utilizing a sidewall image transfer (SIT) process (not depicted). In an SIT process, spacers can be formed on a dummy mandrel. The dummy mandrel can be removed and the remaining spacers can be used as a hard mask to etch the top semiconductor layer. The spacers can then be removed after the semiconductor fins 20 have been formed.

Figure 2:
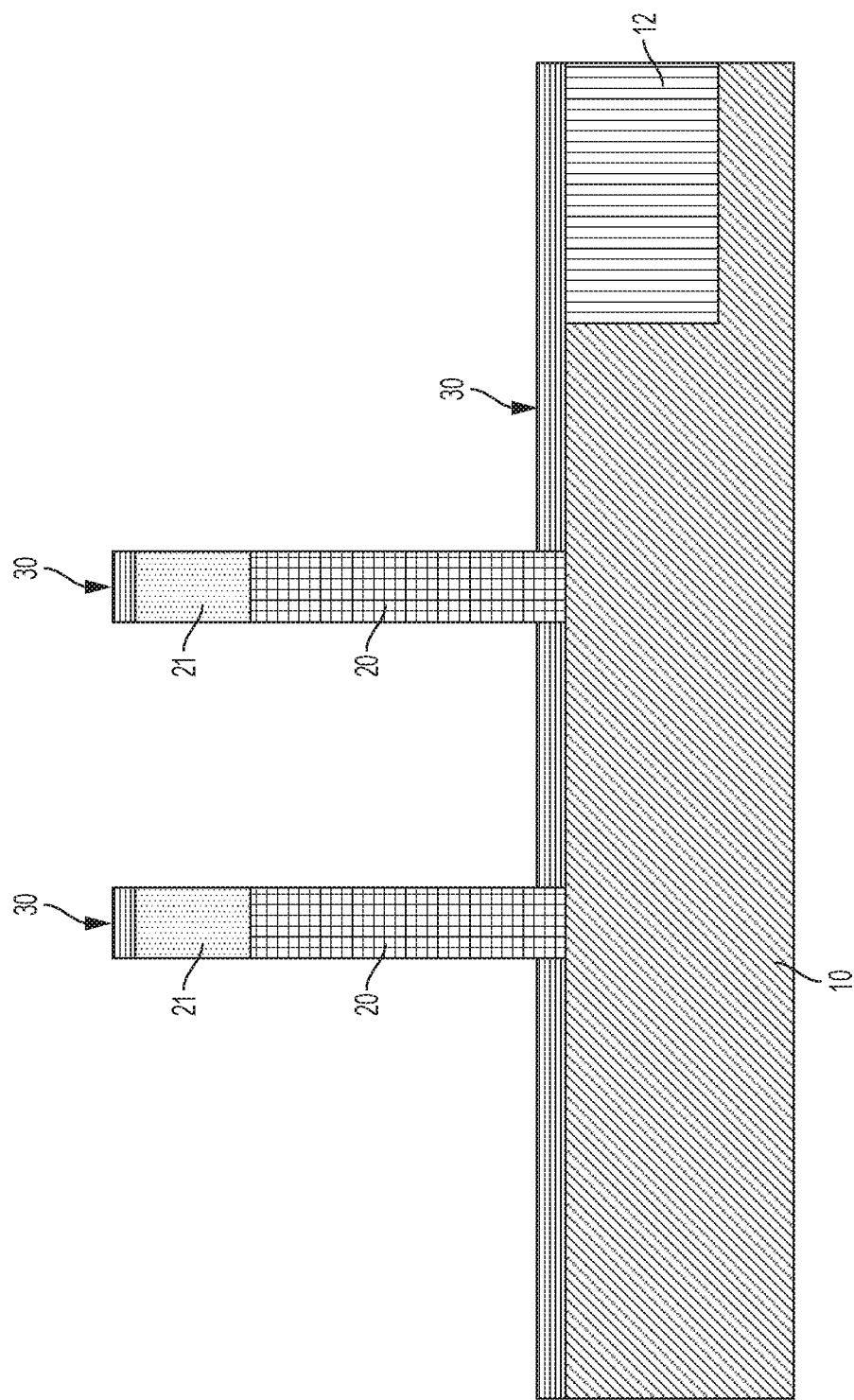
FIG. 2 depicts a cross-sectional view of the semiconductor structure after a processing operation according to one or more embodiments of the present invention.

FIG. 2 depicts a cross-sectional view of a VFET structure after a first bottom spacer formation during an intermediate operation of the exemplary method of fabricating a semiconductor device according to one or more embodiments of the invention. As depicted in FIG. 2, a first bottom spacer 30 is formed on the hard mask 21, substrate 10, and STI 12. The first bottom spacer 30 can include a dielectric material, such as silicon oxide, silicon nitride, silicon oxynitride, or a combination thereof, and can be formed using known deposition processes.

In some embodiments, the first bottom spacer 30 is formed by performing a directional deposition process such as, for example, a Gas Cluster Ion Beam (GCIB) process. The GCIB process is a deposition process that can be highly directional in nature. For example, the directional deposition process can result in the deposition of dielectric material on the horizontally oriented surfaces of the device, such as the upper surface of the hard mask 21 and the substrate 10, while avoiding deposition of any substantial amount of dielectric material on the vertically-oriented surfaces of the device, such as sidewalls of the semiconductor fins 20.

Figure 3:
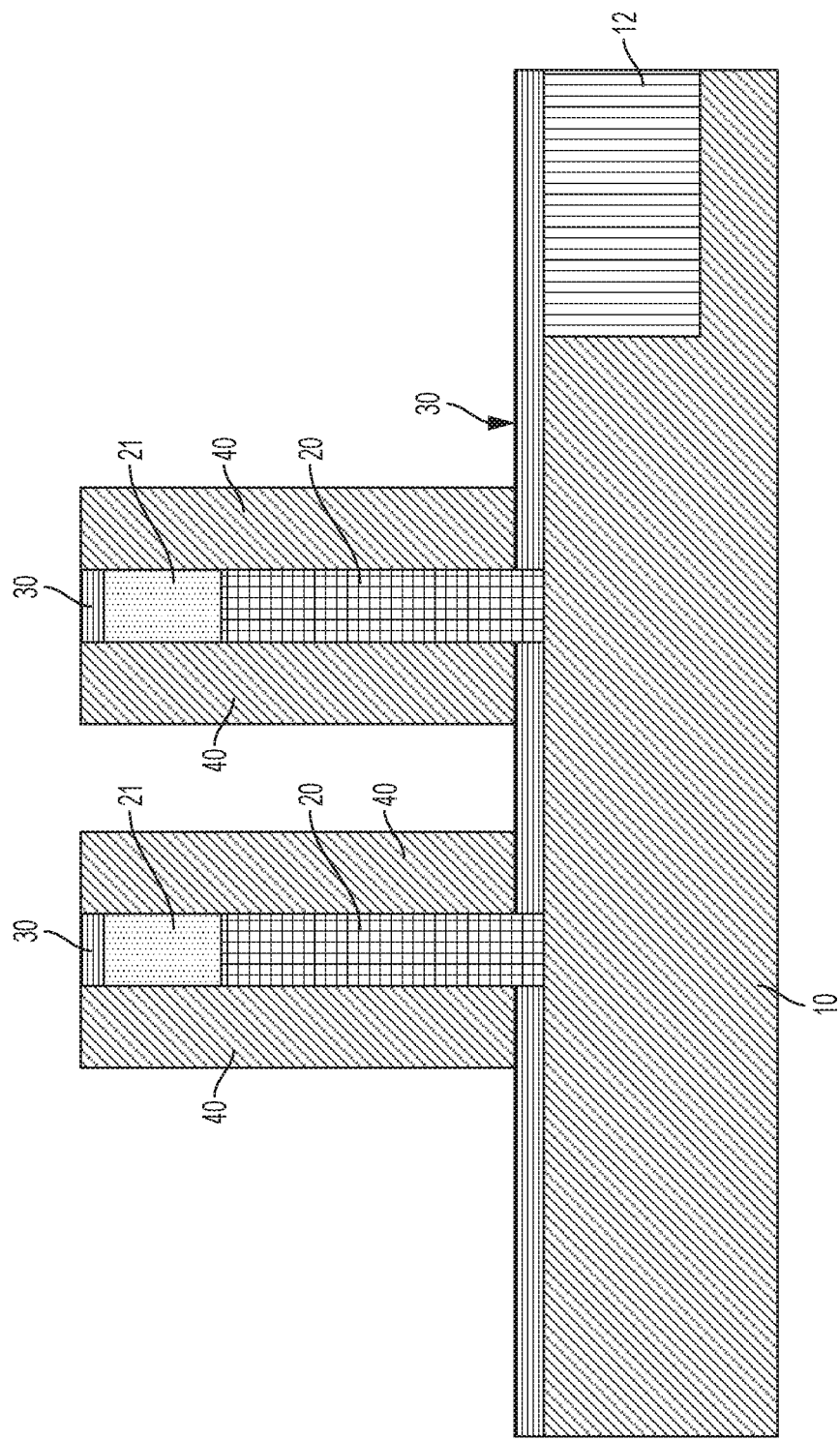
FIG. 3 depicts a cross-sectional view of the semiconductor structure after a processing operation according to one or more embodiments of the present invention.
Figure 4:
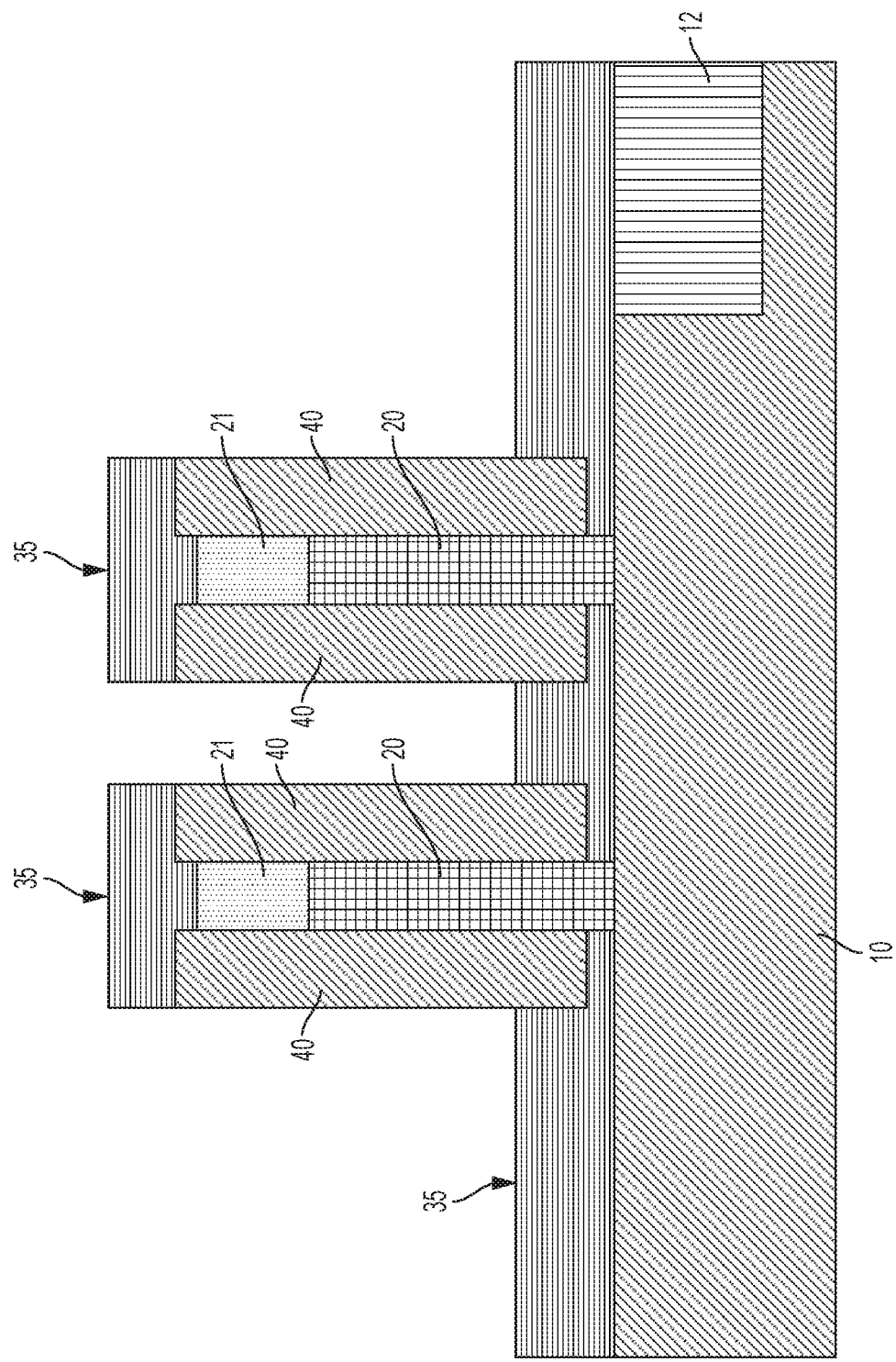
FIG. 4 depicts a cross-sectional view of the semiconductor structure after a processing operation according to one or more embodiments of the present invention.

FIG. 3 depicts a cross-sectional view of a VFET structure after sacrificial spacer deposition during an intermediate operation of the exemplary method of fabricating a semiconductor device according to one or more embodiments of the invention. As depicted in FIG. 3, sacrificial spacers (e.g., a Low Temperature Oxide (LTO)) 40 are deposited on sidewalls of the semiconductor fins 20, the hard mask 21, and the portion of the first bottom spacer 30 on top of the hard mask 21. In this manner, the sacrificial spacers 40 cover the channel regions of the VFET structure and non-channel regions of the first bottom spacer 30 can be increased in thickness (as depicted in FIG. 4). In some embodiments, the sacrificial spacers 40 are formed by deposition of a spacer material layer and subsequently etching the spacer material layer using, for example, RIE selective to the first bottom spacer 30.

The sacrificial spacers 40 can be a dielectric material, such as silicon oxide, silicon nitride, silicon oxynitride, a low-k material, or a combination thereof. The low-k material can be a dielectric material having a dielectric constant less than about 7, for example, less than about 5 or even less than about 2.5, such as, for example, carbon containing silicon materials such as silicon oxycarbides (SiOC) or silicon carbides, silicon nitrides (SiN), or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof.

FIG. 4 depicts a cross-sectional view of a VFET structure after a second bottom spacer formation during an intermediate operation of the exemplary method of fabricating a semiconductor device according to one or more embodiments of the invention. A second bottom spacer 35 can be formed on exposed, e.g., upper, surfaces of the first bottom spacer 30 which are not covered by the sacrificial spacers 40 (as depicted in FIG. 3) and upper surfaces of the sacrificial spacers 40. The second bottom spacer 35 can include a dielectric material, such as silicon oxide, silicon nitride, silicon oxynitride, or a combination thereof, and can be formed using a deposition process such as, for example, GCIB, in a similar manner as the first bottom spacer 30. In some embodiments, the second bottom spacer 35 can include a same material as the first bottom spacer 30.

The second bottom spacer 35 effectively increases the thickness of the first bottom spacer 30. As discussed previously herein, increasing the thickness of the first bottom spacer 30, e.g., by forming a second bottom spacer 35 over the first bottom spacer 30, in non-channel regions of the VFET structure increases the distance separating portions of the gate (discussed further herein and depicted in FIG. 7) in the non-channel regions from the heavily doped region 11 (depicted in FIG. 1)—decreasing the parasitic capacitance of the VFET structure.

Figure 5:
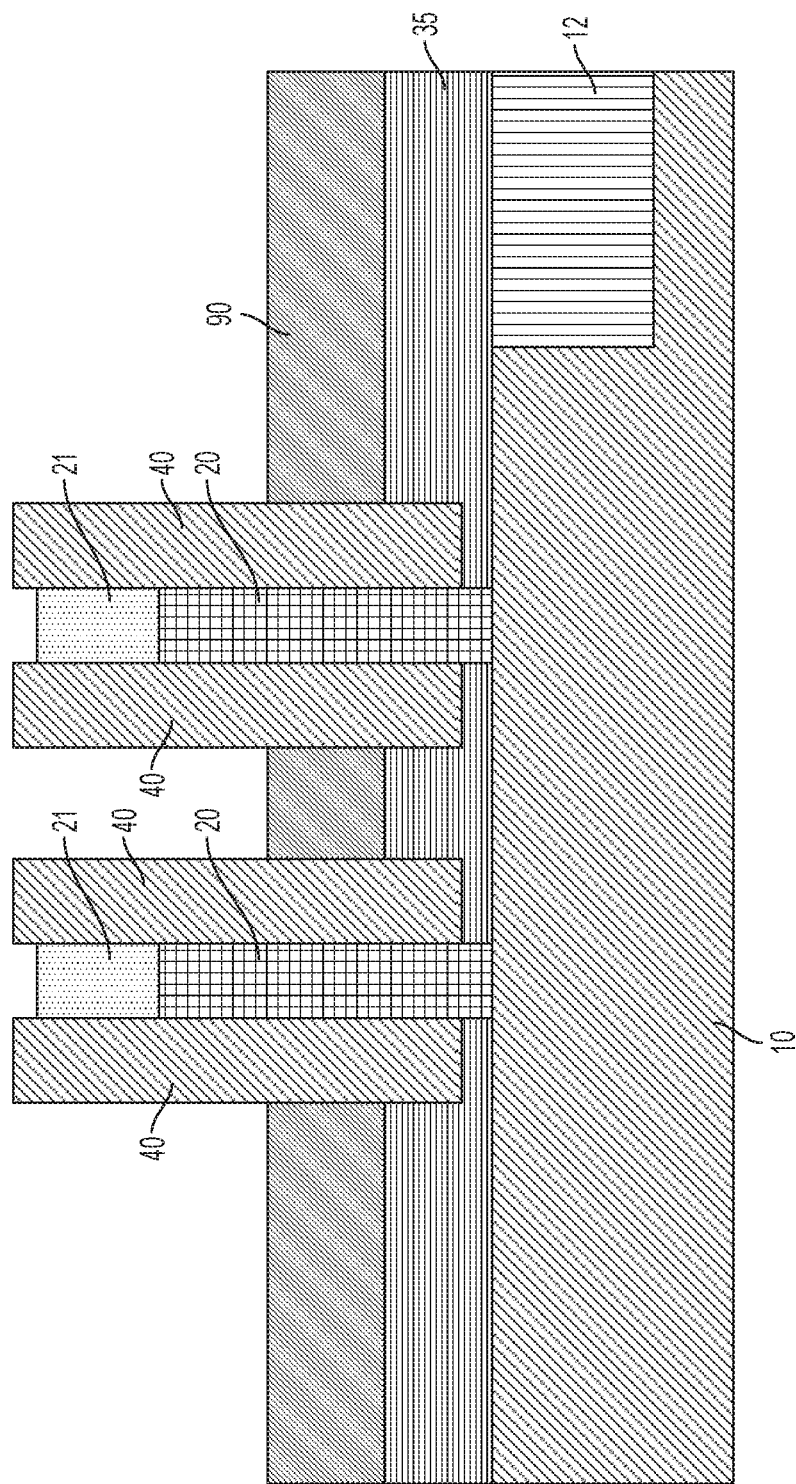
FIG. 5 depicts a cross-sectional view of the semiconductor structure after a processing operation according to one or more embodiments of the present invention.

FIG. 5 depicts a cross-sectional view of a VFET structure after an organic planarizing layer (OPL) formation and an etch back process during an intermediate operation of the exemplary method of fabricating a semiconductor device according to one or more embodiments of the invention. As depicted in FIG. 5, an OPL 90 is formed over portions of the second bottom spacer 35. The OPL 90 can include an organic-based planarization material. Exemplary organic planarization materials include polyacrylate resin, epoxy resin, phenol resin, polyamide resin, polyimide resin, unsaturated polyester resin, polyphenyleneether resin, and polyphenylene sulfide resin. The OPL 90 can be formed by a method, such as, for example, spinning coating, spray coating, dip coating, and roller coating.

An etch back process then removes portions of the second bottom spacer 35 on the hard mask 21 and the sacrificial spacers 40. In some embodiments, the portions of the second bottom spacer 35 on the hard mask 21 and the sacrificial spacers 40 are removed using an etch selective to the OPL 90 and/or the sacrificial spacers 40. The OPL 90 protects the second bottom spacer 35 during this etch process.

Figure 6:
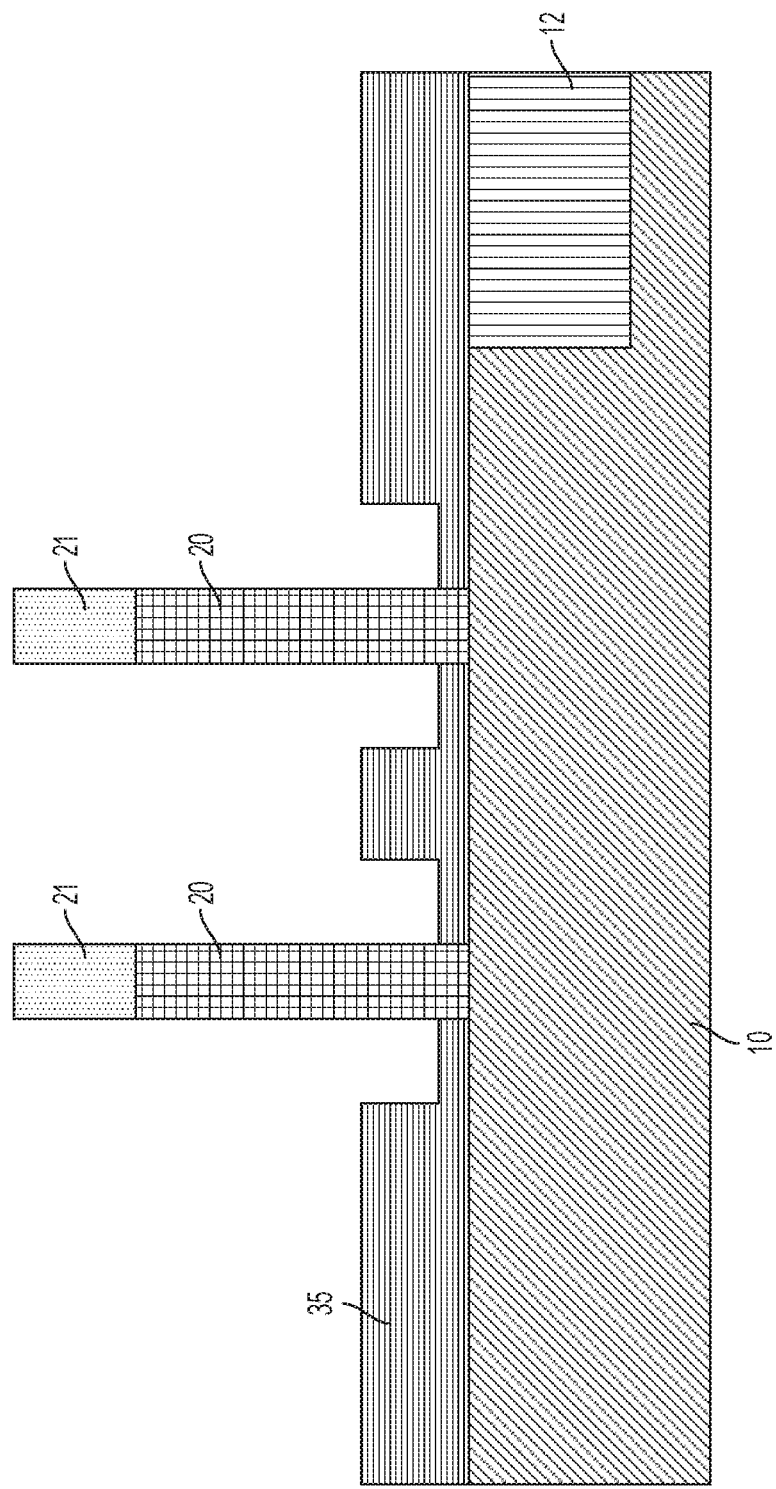
FIG. 6 depicts a cross-sectional view of the semiconductor structure after a processing operation according to one or more embodiments of the present invention.

FIG. 6 depicts a cross-sectional view of a VFET structure after sacrificial oxide removal and OPL strip during an intermediate operation of the exemplary method of fabricating a semiconductor device according to one or more embodiments of the invention. As depicted in FIG. 6, the sacrificial spacers 40 and the OPL are removed. The OPL 90 can be removed by an anisotropic etch, such as, for example, a RIE, or by chemical wet etching, or by sulfuric acid stripping. The sacrificial spacers 40 can be removed using, for example, a wet etch, a dry etch, or a combination of sequential wet and/or dry etches. In some embodiments, the sacrificial spacers 40 are selective to the second bottom spacer 35.

Figure 7:
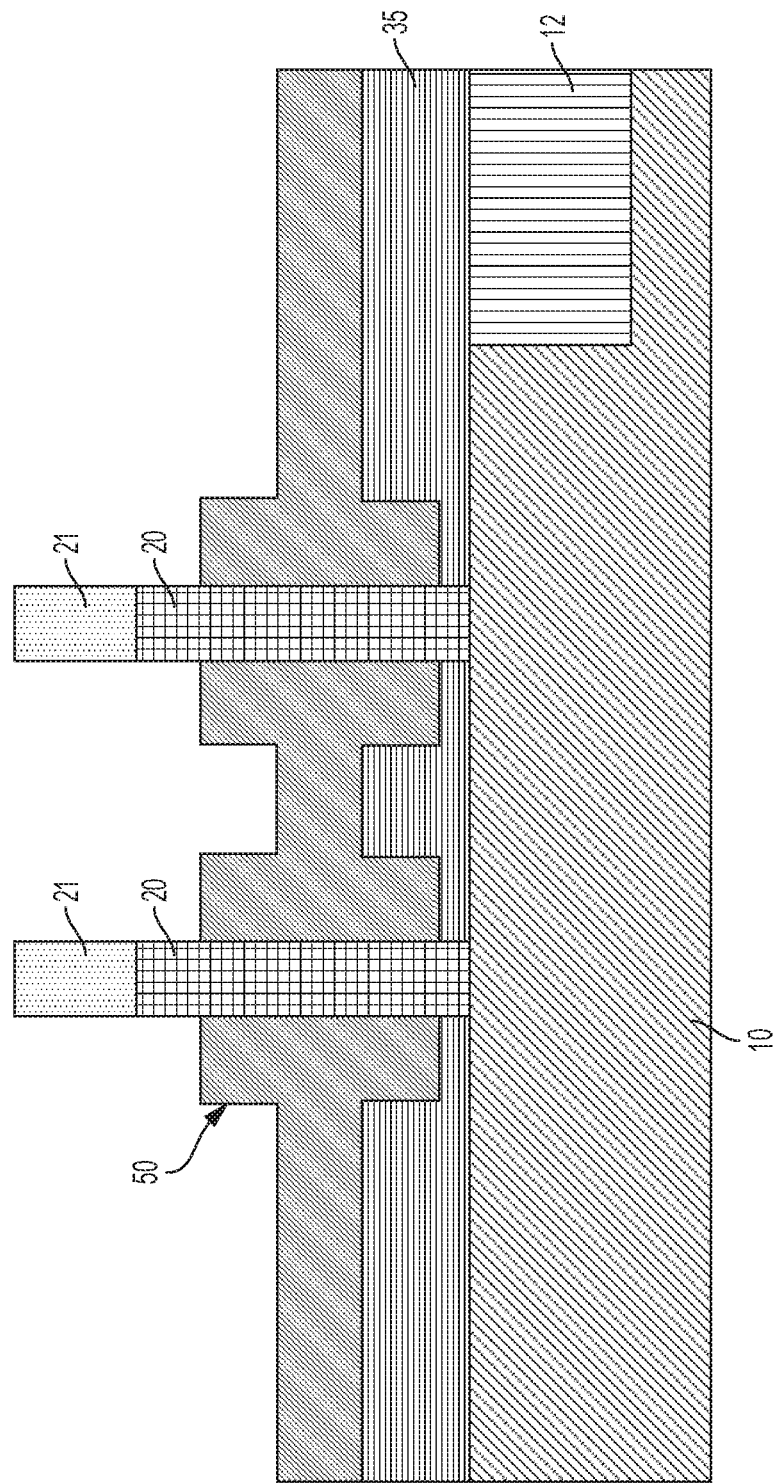
FIG. 7 depicts a cross-sectional view of the semiconductor structure after a processing operation according to one or more embodiments of the present invention.

FIG. 7 depicts a cross-sectional view of a VFET structure after a high dielectric constant (high-k) metal gate formation during an intermediate operation of the exemplary method of fabricating a semiconductor device according to one or more embodiments of the invention. As depicted in FIG. 7, a high dielectric constant conductive gate 50 (hereinafter conductive gate 50) can be formed by, for example, deposition, over channel regions (i.e., sidewalls) of the semiconductor fins 20 and the second bottom spacer 35. In some embodiments, the deposition of the conductive gate 50 forms a seam due to a pinch-off effect in the channel region of the semiconductor fins 20. In some embodiments, portions of the conductive gate 50 in non-channel regions of the VFET structure are recessed via, e.g., chamfering, to help reduce gate resistance.

The conductive gate 50 can be made of any suitable gate material, such as, for example, a high dielectric constant material having a dielectric constant greater than silicon dioxide. Exemplary high dielectric constant material include, for example, HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, SiON, SiNx, a silicate thereof, and an alloy thereof, where each value of x is independently from 0.5 to 3 and each value of y is independently from 0 to 2.

Figure 8:
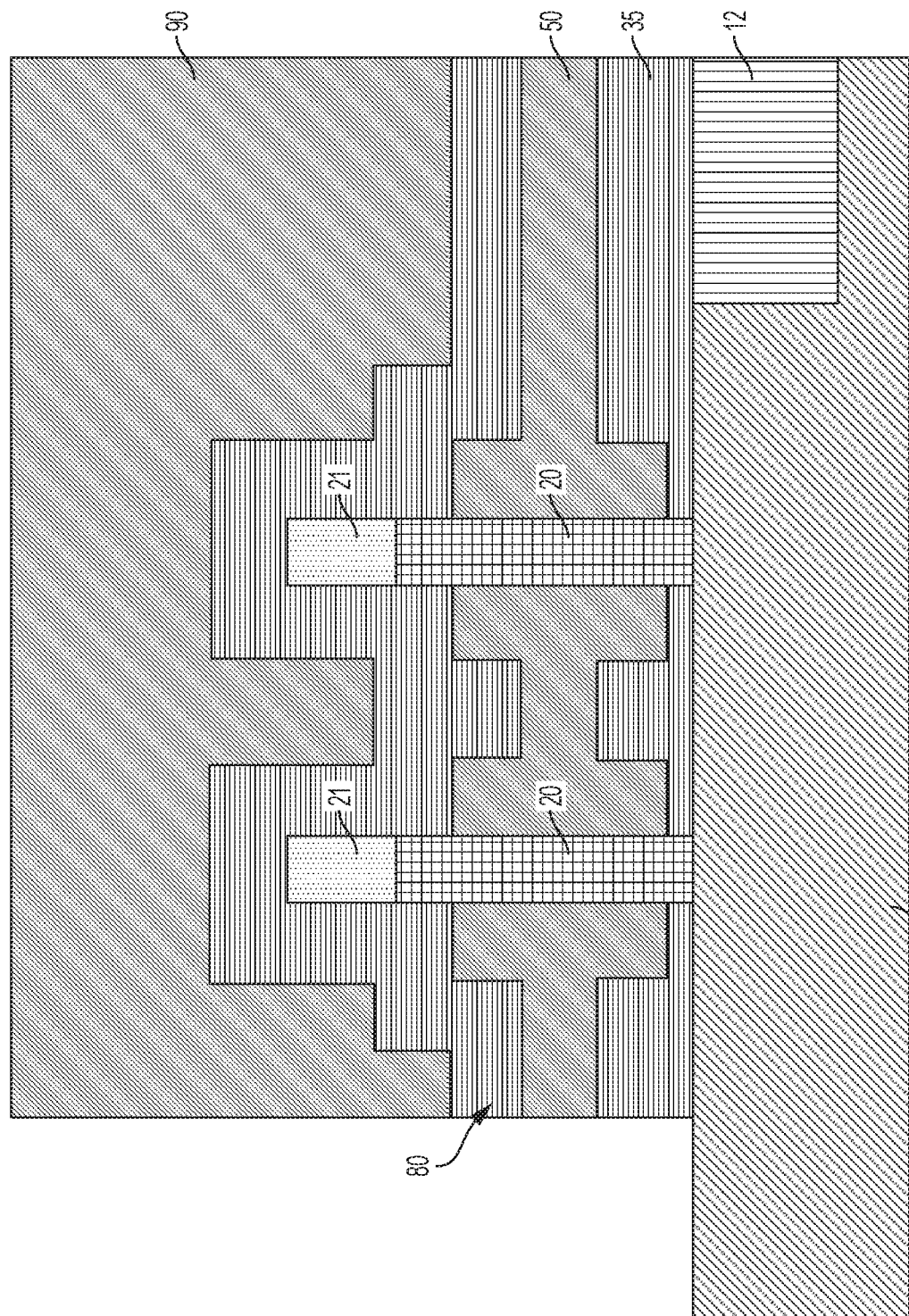
FIG. 8 depicts a cross-sectional view of the semiconductor structure after a processing operation according to one or more embodiments of the present invention.

FIG. 8 depicts a cross-sectional view of a VFET structure after top spacer formation, OPL formation, and gate patterning during an intermediate operation of the exemplary method of fabricating a semiconductor device according to one or more embodiments of the invention. As depicted in FIG. 8, a top spacer 80 can be formed over the conductive gate 50. The top spacer 80 can include a dielectric material, such as silicon oxide, silicon nitride, silicon oxynitride, or a combination thereof, and can be formed using a deposition process such as, for example, GCIB, in a similar manner as the second bottom spacer 35. In some embodiments, the top spacer 80 can include a same material as the first bottom spacer 30 and/or the second bottom spacer 35.

An OPL 90 is formed on the top spacer 80. The OPL 90 can include an organic-based planarization material. Exemplary organic planarization materials include polyacrylate resin, epoxy resin, phenol resin, polyamide resin, polyimide resin, unsaturated polyester resin, polyphenyleneether resin, and polyphenylene sulfide resin. The OPL 90 can be formed by any known processes, such as, for example, spinning coating, spray coating, dip coating, and roller coating.

Portions of the OPL 90, top spacer 80, conductive gate 50, and second bottom spacer 35 are removed to expose a portion of the substrate 10 and to pattern the conductive gate 50. The removal of portions of the OPL 90, the top spacer 80, conductive gate 50, and the second bottom spacer 35 can be done by any lithographic or etching methodology, such as, for example, a RIE selective to the substrate 10.

Figure 9:
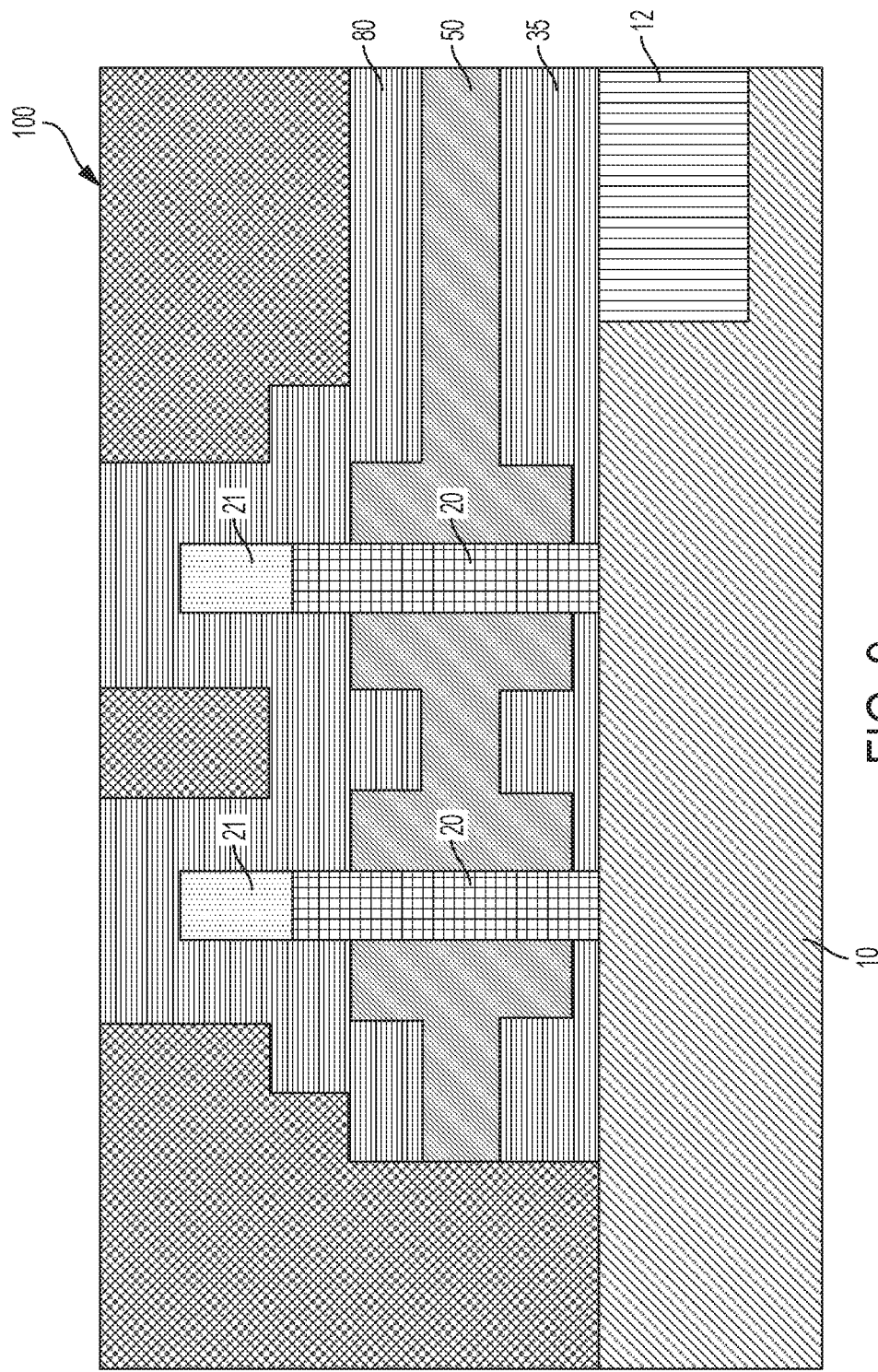
FIG. 9 depicts a cross-sectional view of the semiconductor structure after a processing operation according to one or more embodiments of the present invention.

FIG. 9 depicts a cross-sectional view of a VFET structure after an ILD formation during an intermediate operation of the exemplary method of fabricating a semiconductor device according to one or more embodiments of the invention. As depicted in FIG. 9, the OPL 90 can be removed, and an interlayer dielectric (ILD) 100 can be deposited over the resulting structure, for example, to fill regions between the semiconductor fins 20. The ILD 100 can be any suitable dielectric material, such as, for example, a silicon oxide.

The ILD 100 can be polished using, for example, CMP selective to the top spacer 80. The CMP process can be utilized to remove excess portions of ILD 100 such that the upper surface of ILD 100 is coplanar with the upper surface of the top spacer 80. In some embodiments, the material of ILD 100 is chosen such that portion of the top spacer 80 and the hard mask 21 can be removed selective to the ILD 100 during a subsequent etching (as depicted in FIG. 10).

Figure 10:
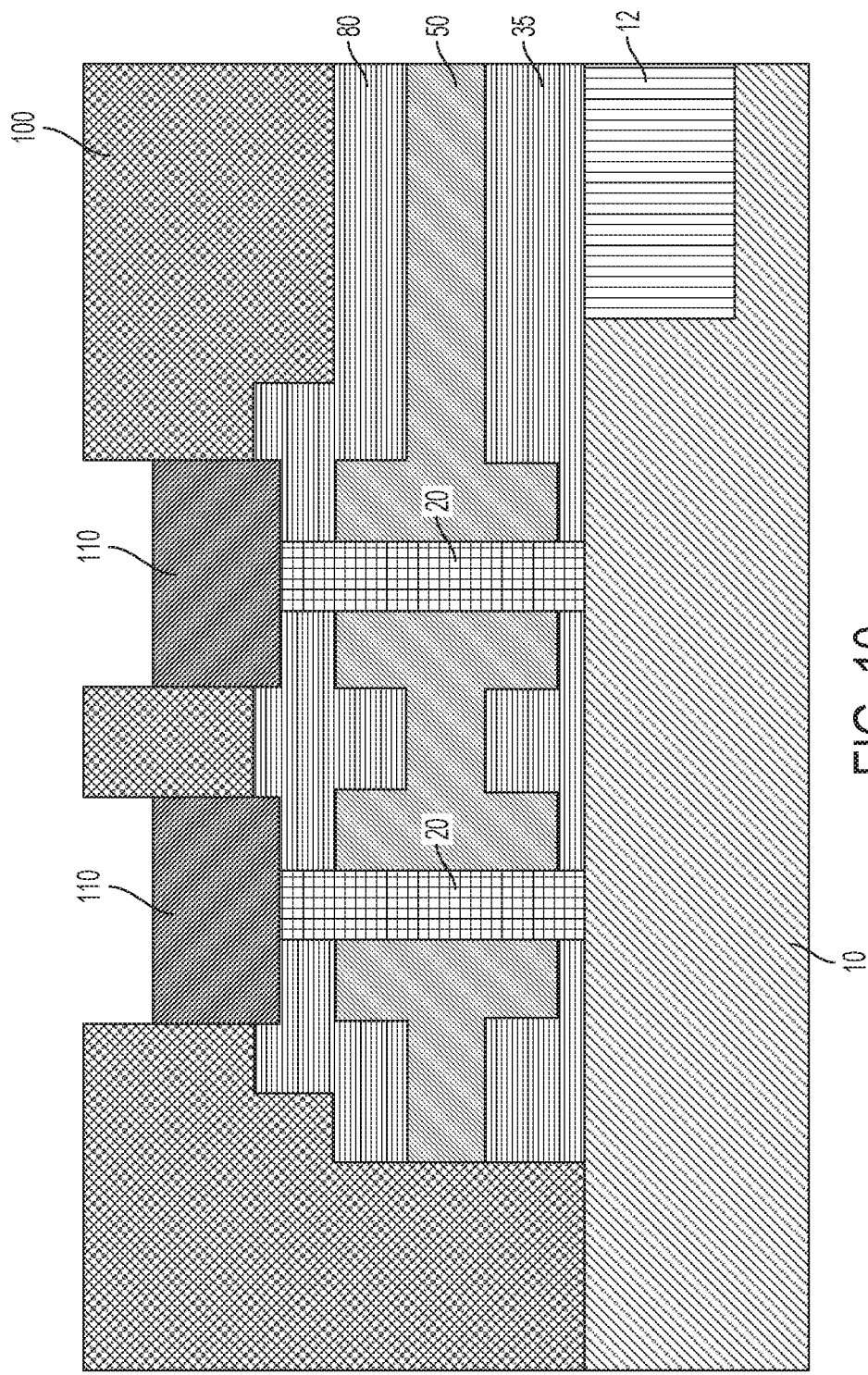
FIG. 10 depicts a cross-sectional view of the semiconductor structure after a processing operation according to one or more embodiments of the present invention.

FIG. 10 depicts a cross-sectional view of a VFET structure after top spacer opening and top drain formation during an intermediate operation of the exemplary method of fabricating a semiconductor device according to one or more embodiments of the invention. As depicted in FIG. 10, a portion of the top spacer 80 and the hard mask 21 is removed to expose portions of the semiconductor fins 20. A top S/D 110 is then formed on the exposed portions of the semiconductor fins 20.

The top S/D 110 can be an epitaxial silicon layer epitaxially grown using known processes. Epitaxial materials can be grown from gaseous or liquid precursors. Epitaxial materials can be grown using, for example, vapor-phase epitaxy (VPE), molecular-beam epitaxy (MBE), or liquid-phase epitaxy (LPE). Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the top S/D 110 can range from about $1 \times 10^{19}$ cm-3 to about $2 \times 10^{21}$ cm-3, for example, between about $2 \times 10^{20}$ cm-3 to about $1 \times 10^{21}$ cm-3. In some embodiments of the invention, the gas source for the deposition of epitaxial semiconductor materials can include a silicon containing gas source, a germanium containing gas source, or a combination thereof.

Figure 11:
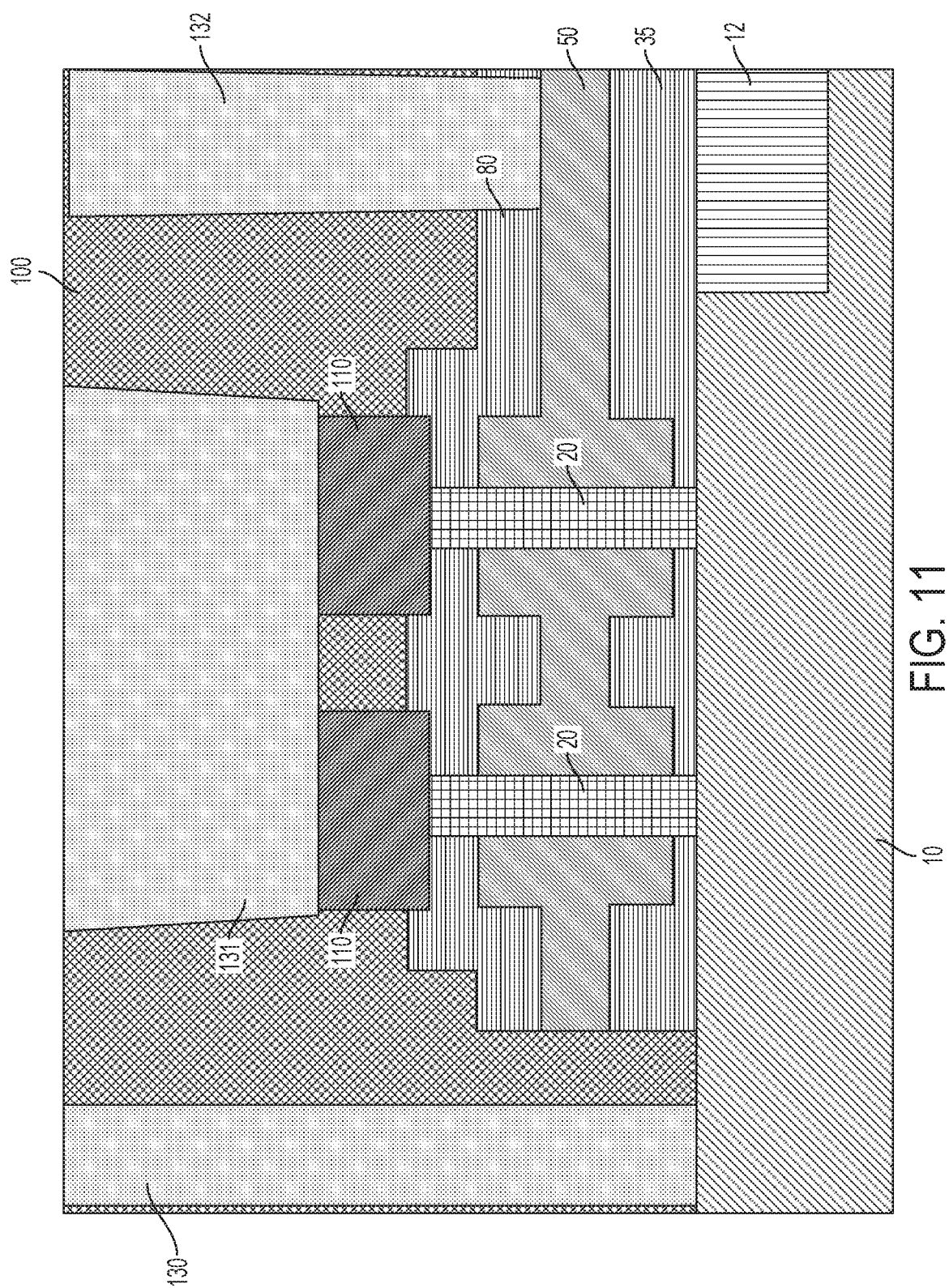
FIG. 11 depicts a cross-sectional view of the semiconductor structure after a processing operation according to one or more embodiments of the present invention.

FIG. 11 depicts a cross-sectional view of a VFET structure after contact formation during an intermediate operation of the exemplary method of fabricating a semiconductor device according to one or more embodiments of the invention. As depicted in FIG. 11, a conductive contact 130 is formed in ohmic contact with electrically-active areas of the substrate 10. The conductive contact 130 can be formed using known metallization techniques. For example, in some embodiments the ILD 100 is extended and then patterned with open trenches. The conductive contact 130 is then deposited into the trenches. In some embodiments, the conductive contact 130 is overfilled into the trenches, forming overburdens above a surface of the ILD. In some embodiments, a CMP selective to the ILD removes the overburden.

The conductive contact 130 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the conductive contact 130 can be copper and can include a barrier metal liner (not depicted). The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

A local interconnect line 131 in ohmic contact with the top S/D 110 and plugs 132 in ohmic contact with the high dielectric constant metal gate 50 are also formed. The local interconnect line 131 and plugs 132 can be formed using known metallization techniques, and can be made of a similar material as the conductive contact 130.

Figure 12:
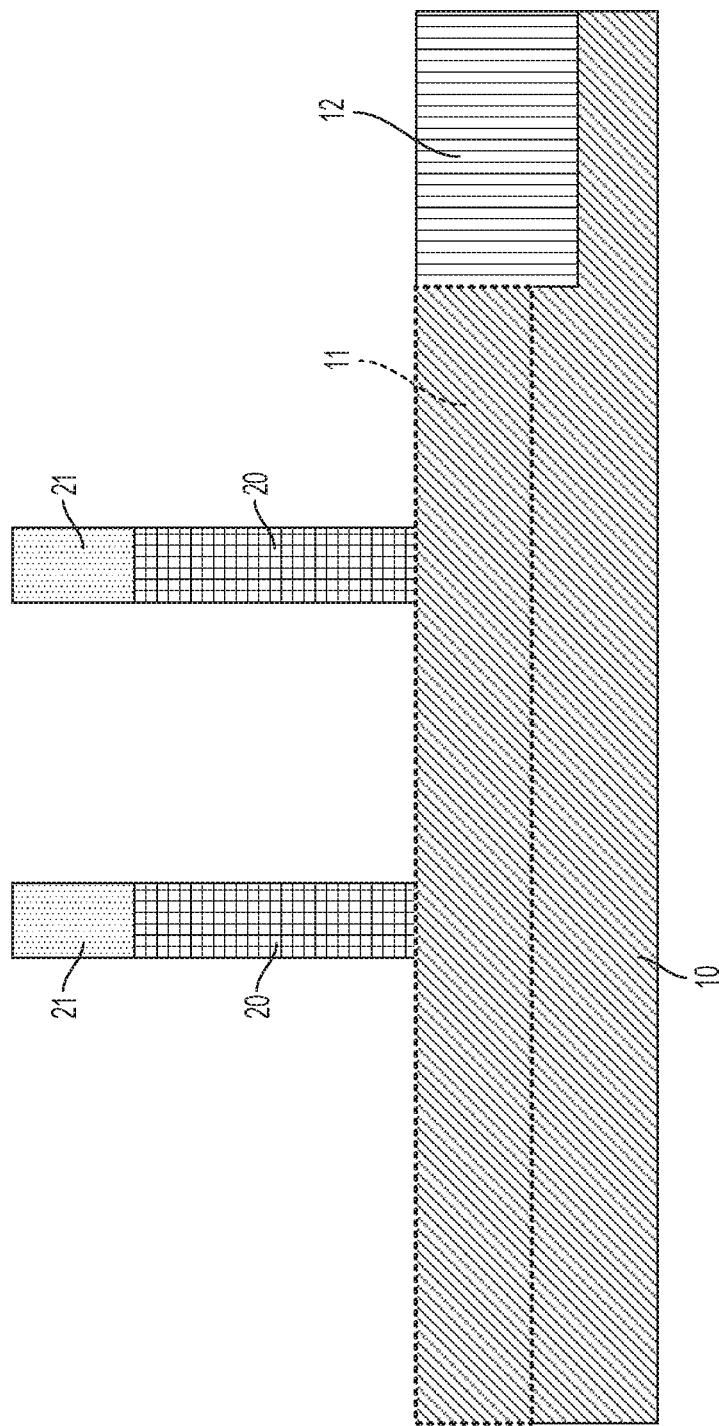
FIG. 12 depicts a cross-sectional view of a semiconductor structure after a processing operation according to one or more embodiments of the present invention.

FIG. 12 depicts a cross-sectional view of a VFET structure formed on a substrate during an intermediate operation of an example method of fabricating a semiconductor device according to one or more embodiments of the invention. As depicted in FIG. 12, a partially fabricated semiconductor device can include multiple semiconductor fins 20, hard mask 21, a substrate 10 having a heavily doped region 11, and a STI structure 12, each formed in a similar manner as in the VFET structure depicted in FIG. 1.

Figure 13:
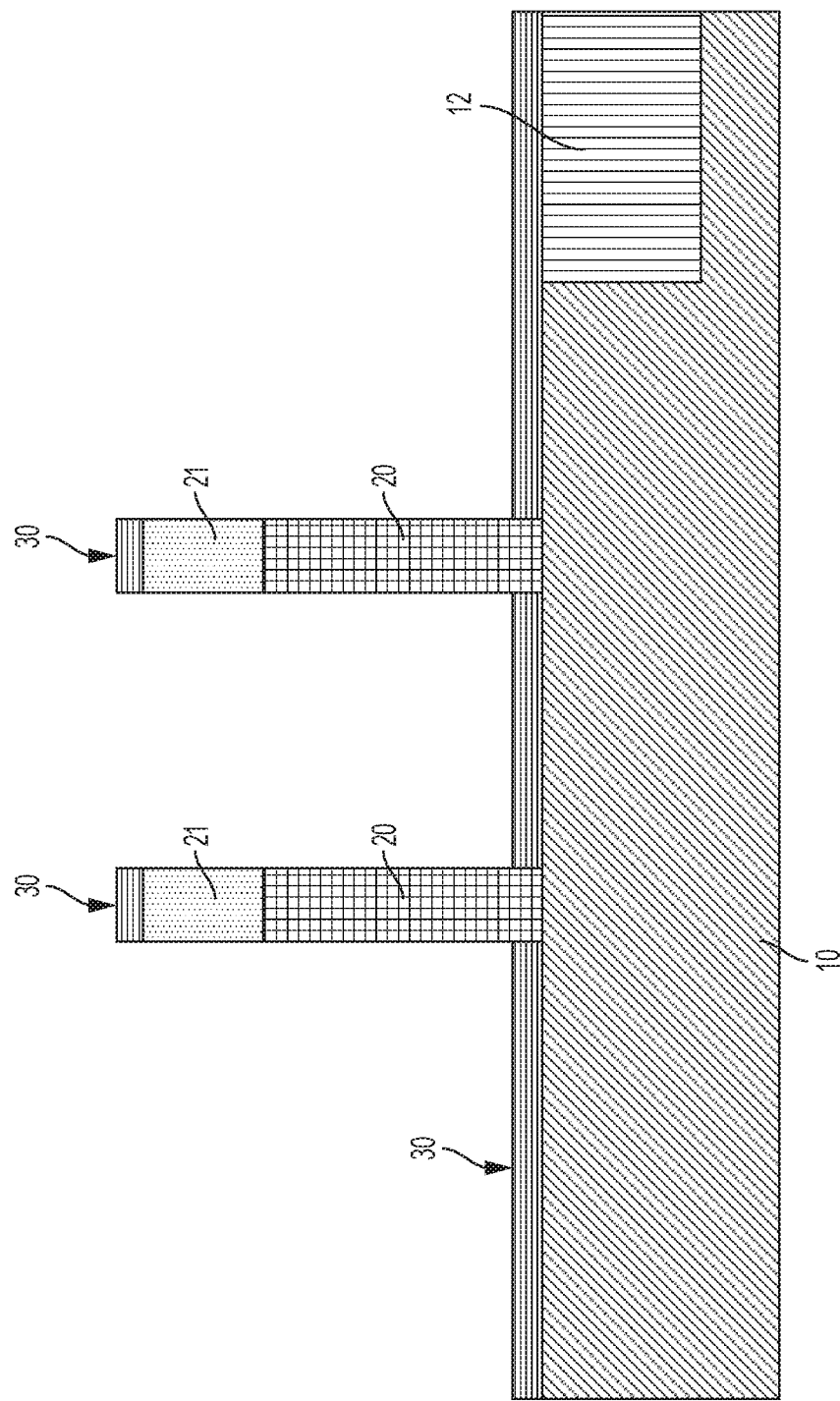
FIG. 13 depicts a cross-sectional view of the semiconductor structure after a processing operation according to one or more embodiments of the present invention.

FIG. 13 depicts a cross-sectional view of a VFET structure after a first bottom spacer formation during an intermediate operation of the example method of fabricating a semiconductor device according to one or more embodiments of the invention. As depicted in FIG. 13, a first bottom spacer 30 can be formed on the hard mask 21, substrate 10, and STI 12. The first bottom spacer 30 can include a dielectric material, such as silicon oxide, silicon nitride, silicon oxynitride, or a combination thereof, and can be formed using a deposition process such as, for example, GCIB.

Figure 14:
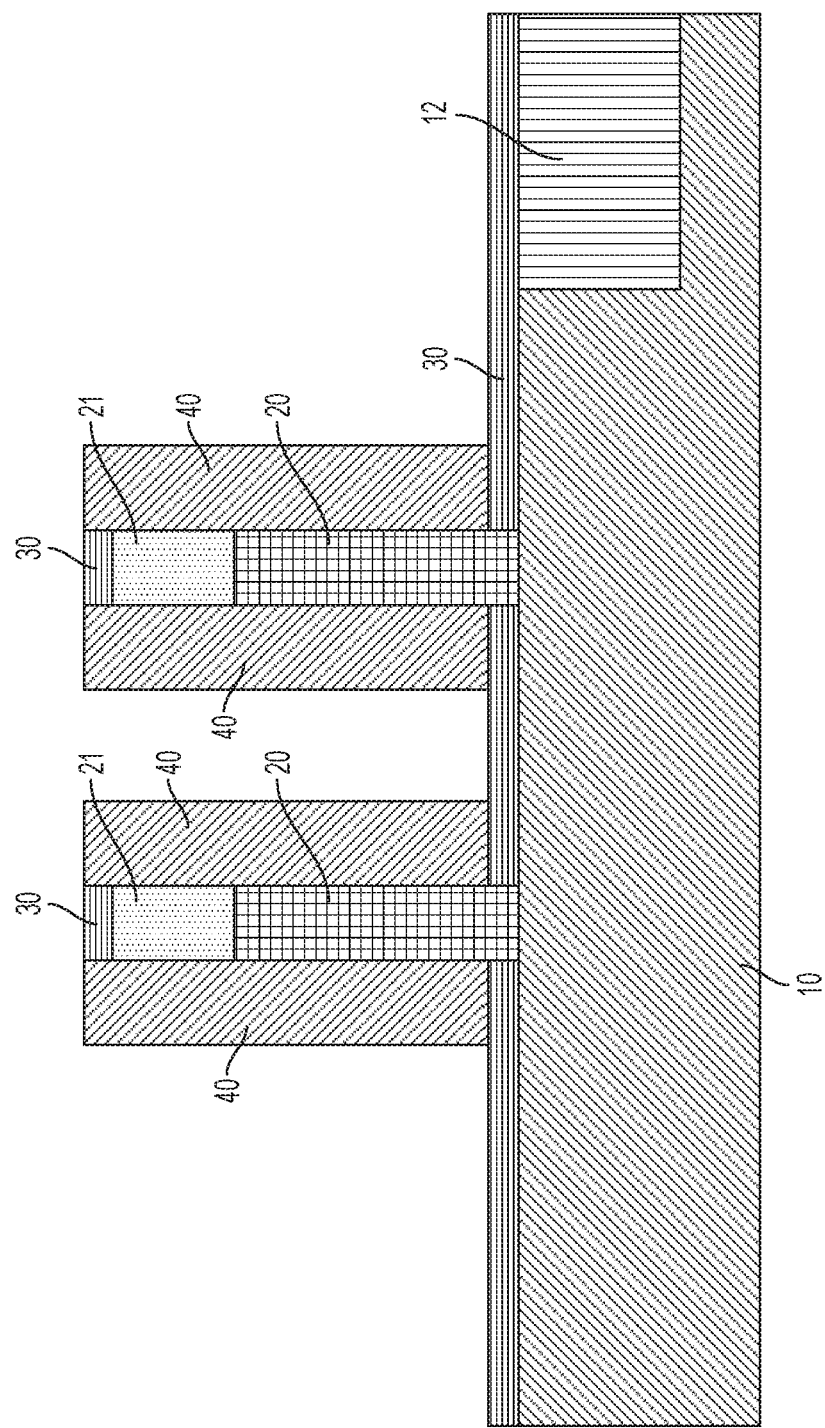
FIG. 14 depicts a cross-sectional view of the semiconductor structure after a processing operation according to one or more embodiments of the present invention.
Figure 15:
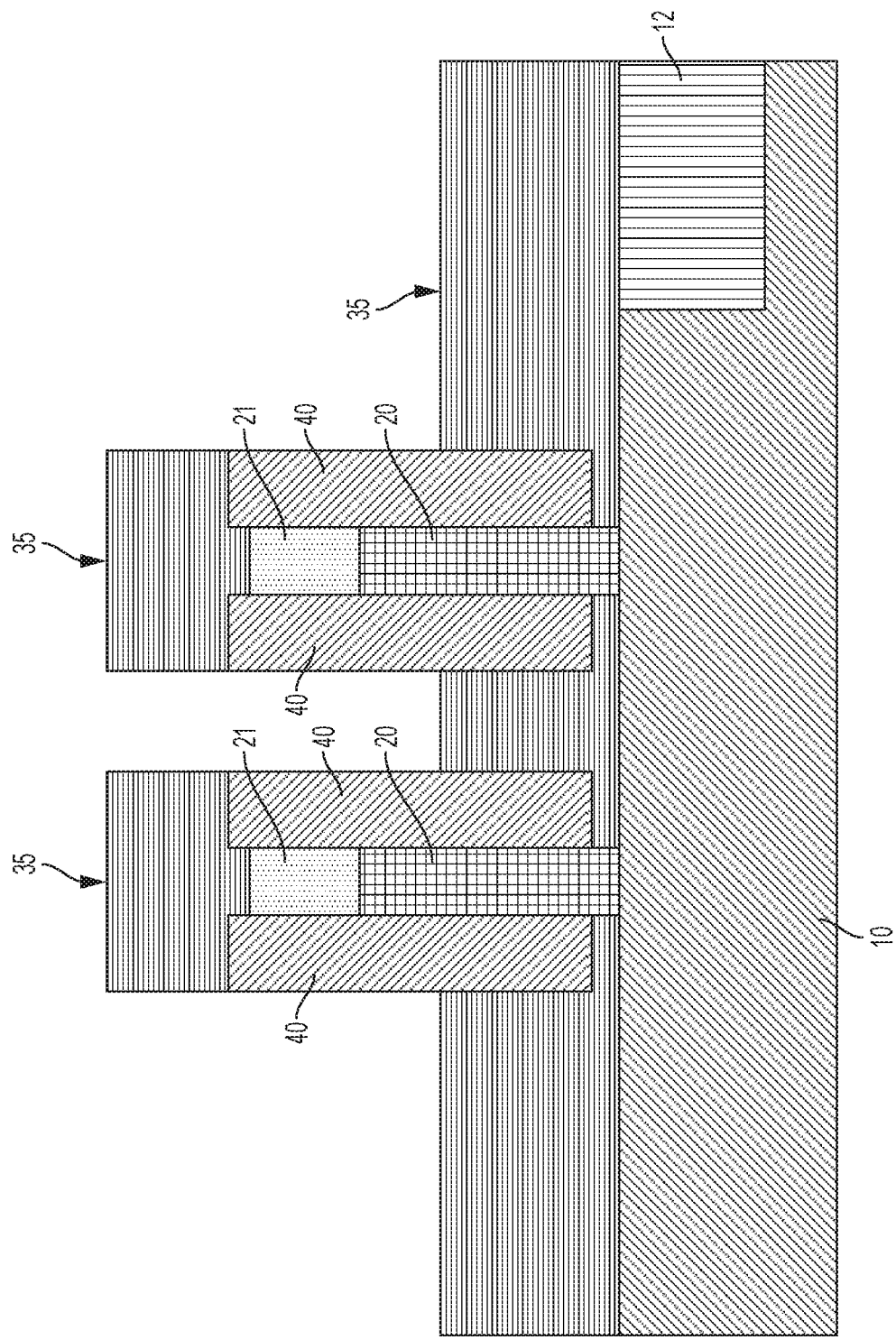
FIG. 15 depicts a cross-sectional view of the semiconductor structure after a processing operation according to one or more embodiments of the present invention.

FIG. 14 depicts a cross-sectional view of a VFET structure after sacrificial spacer deposition during an intermediate operation of the example method of fabricating a semiconductor device according to one or more embodiments of the invention. As depicted in FIG. 14, sacrificial spacers (e.g., LTO) 40 are deposited on sidewalls of the semiconductor fins 20, the hard mask 21, and the portion of the first bottom spacer 30 on top of the hard mask 21. In this manner, the sacrificial spacers 40 cover the channel regions of the VFET structure and non-channel regions of the first bottom spacer 30 can be increased in thickness (as depicted in FIG. 15). In some embodiments, the sacrificial spacers 40 are formed by deposition of a spacer material layer and subsequently etching the spacer material layer using, for example, RIE selective to the first bottom spacer 30.

The sacrificial spacers 40 can be a dielectric material, such as silicon oxide, silicon nitride, silicon oxynitride, a low-k material, or a combination. The sacrificial spacers 40 can be formed by deposition of a spacer material and subsequent etching to remove the spacer material except from the sidewalls of the semiconductor fins 20. The low-k material can be a dielectric having a dielectric constant less than about 7, for example, less than about 5 or even less than about 2.5, such as carbon containing silicon materials such as silicon oxycarbides (SiOC) or silicon carbides, silicon nitrides (SiN) or carbon containing silicon nitride materials (SiCN), and/or boron nitride (BN), silicon boron nitride (SiBN), silicon boron carbide nitride (SiBCN), carbon doped silicon oxide, fluorine doped oxide, porous dielectric, or combinations thereof.

FIG. 15 depicts a cross-sectional view of a VFET structure after a second bottom spacer formation during an intermediate operation of the example method of fabricating a semiconductor device according to one or more embodiments of the invention. A second bottom spacer 35 can be formed on exposed, e.g., upper, surfaces of the first bottom spacer 30 which are not covered by the sacrificial spacers 40 (as depicted in FIG. 3) and upper surfaces of the sacrificial spacers 40. The second bottom spacer 35 can include a dielectric material, such as silicon oxide, silicon nitride, silicon oxynitride, or a combination thereof, and can be formed using a deposition process such as, for example, GCIB, in a similar manner as the first bottom spacer 30.

In some embodiments, the second bottom spacer 35 can include a same material as the first bottom spacer 30 and the second bottom spacer 35 effectively increases the thickness of the first bottom spacer 30. As discussed previously herein, increasing the thickness of the first bottom spacer 30, e.g., by forming a second bottom spacer 35 over the first bottom spacer 30 in non-channel regions of the VFET structure, results in a stepped bottom spacer structure that increases the distance separating portions of the gate (discussed further herein and depicted in FIG. 19) in the non-channel regions from the heavily doped region 11 (depicted in FIG. 12)—decreasing the parasitic capacitance of the VFET structure. Moreover, forming the second bottom spacer 35 in this manner allows for a precisely defined gate length, as discussed further herein and as depicted in FIG. 20.

Figure 16:
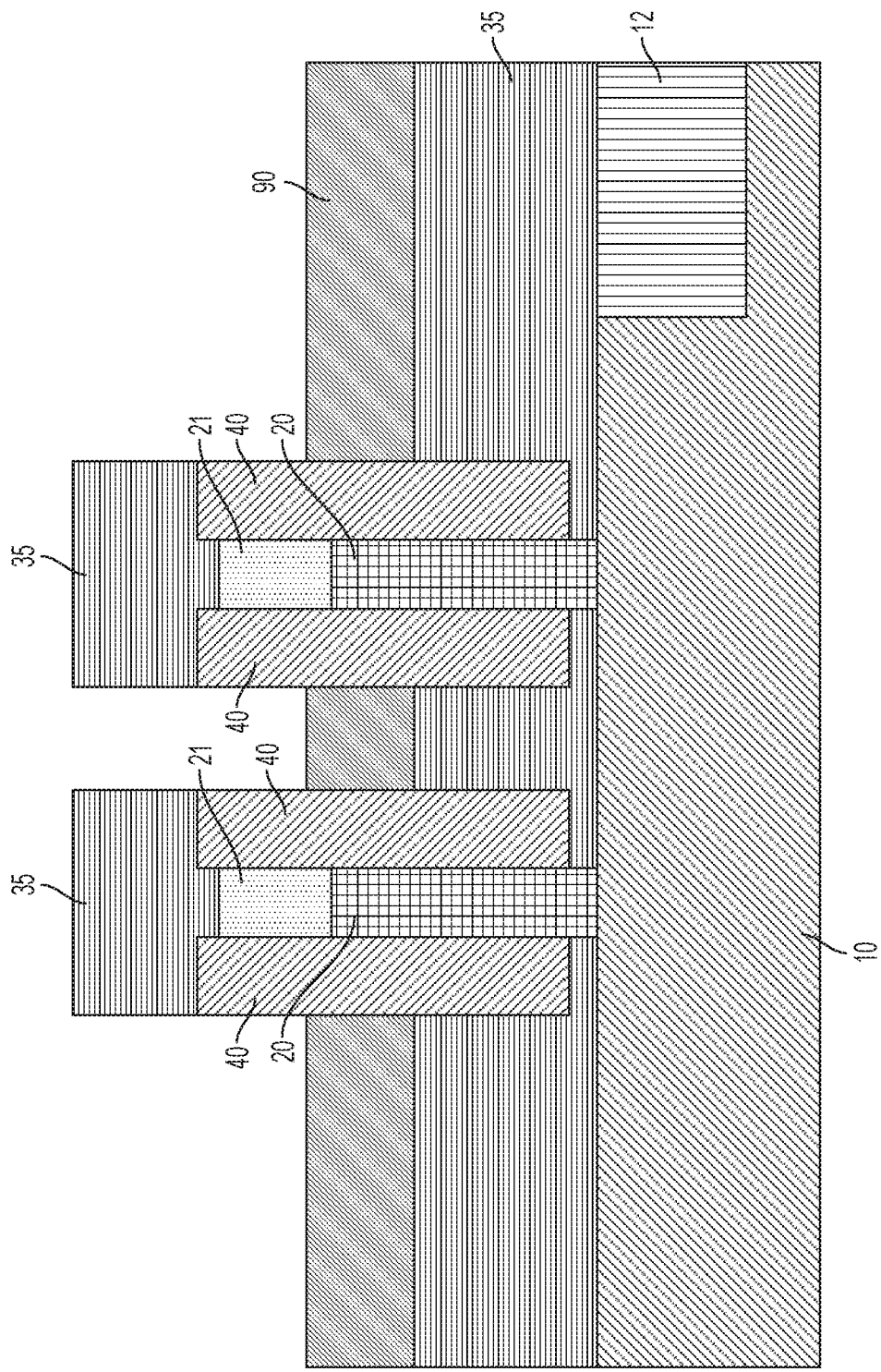
FIG. 16 depicts a cross-sectional view of the semiconductor structure after a processing operation according to one or more embodiments of the present invention.

FIG. 16 depicts a cross-sectional view of a VFET structure after an OPL formation during an intermediate operation of the example method of fabricating a semiconductor device according to one or more embodiments of the invention. As depicted in FIG. 16, an OPL 90 is formed over portions of the second bottom spacer 35. The OPL 90 can include an organic-based planarization material. Exemplary organic planarization materials include polyacrylate resin, epoxy resin, phenol resin, polyamide resin, polyimide resin, unsaturated polyester resin, polyphenylenether resin, and polyphenylene sulfide resin. The OPL 90 can be formed by a method, such as, for example, spinning coating, spray coating, dip coating, and roller coating.

Figure 17:
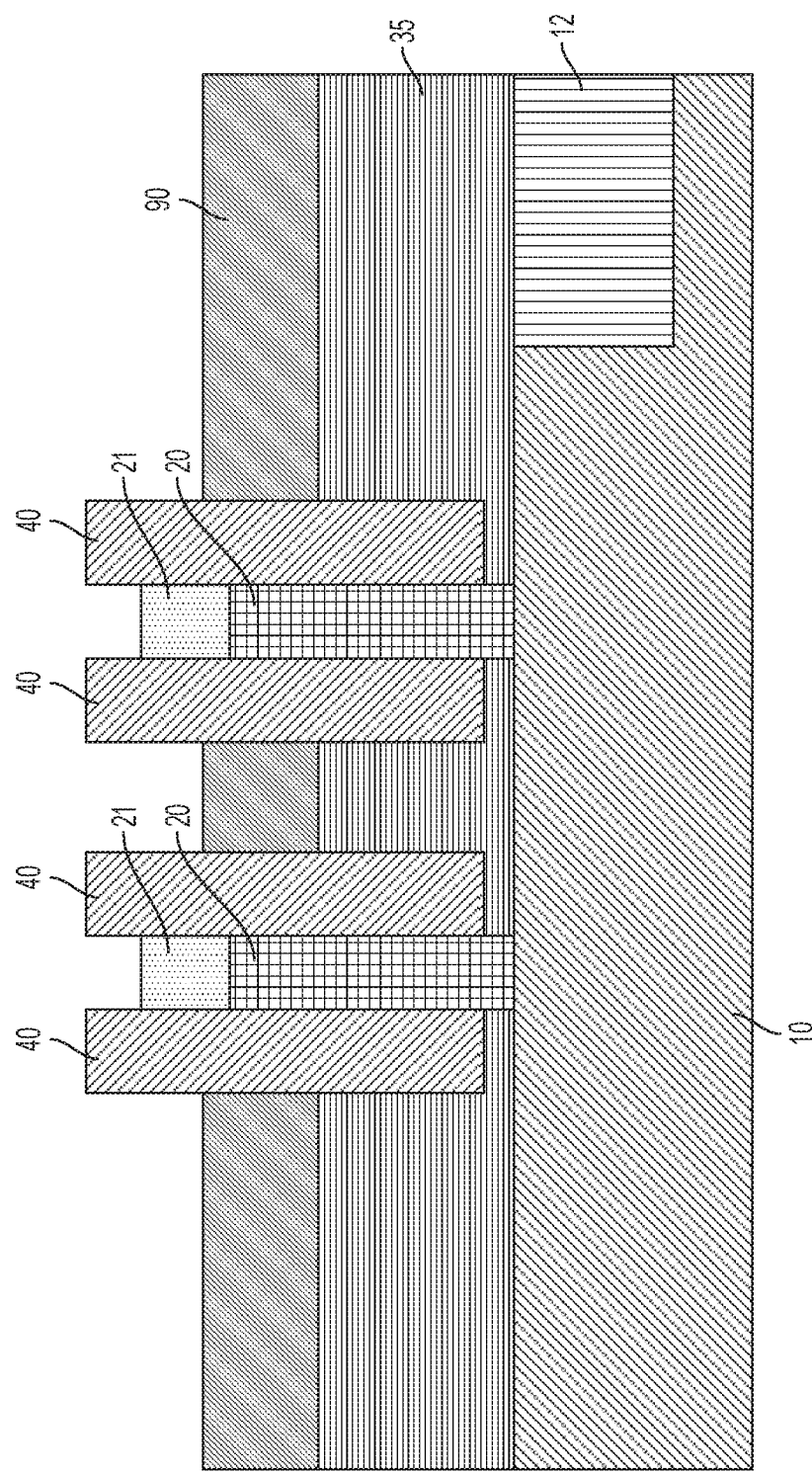
FIG. 17 depicts a cross-sectional view of the semiconductor structure after a processing operation according to one or more embodiments of the present invention.

FIG. 17 depicts a cross-sectional view of a VFET structure after and an etch back process during an intermediate operation of the example method of fabricating a semiconductor device according to one or more embodiments of the invention. As depicted in FIG. 17, an etch back process then removes portions of the second bottom spacer 35 on the hard mask 21 and the sacrificial spacers 40. In some embodiments, the portions of the second bottom spacer 35 on the hard mask 21 and the sacrificial spacers 40 are removed using an etch selective to the OPL 90 and/or the sacrificial spacers 40. The OPL 90 protects the second bottom spacer 35 during this etch process.

Figure 18:
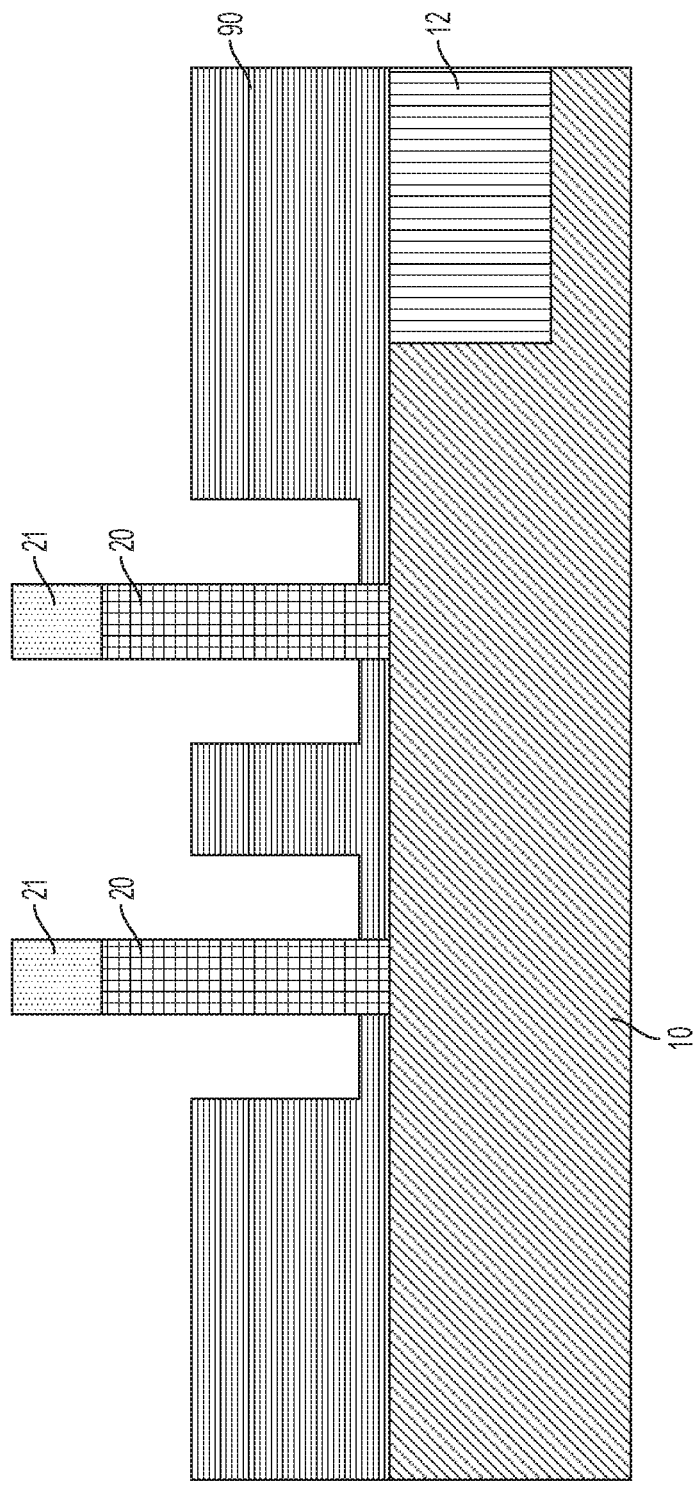
FIG. 18 depicts a cross-sectional view of the semiconductor structure after a processing operation according to one or more embodiments of the present invention.

FIG. 18 depicts a cross-sectional view of a VFET structure after sacrificial oxide removal and OPL strip during an intermediate operation of the example method of fabricating a semiconductor device according to one or more embodiments of the invention. As depicted in FIG. 18, the sacrificial spacers 40 and the OPL are removed. The OPL 90 can be removed by an anisotropic etch, such as, for example, a RIE, or by chemical wet etching, or by sulfuric acid stripping. The sacrificial spacers 40 can be removed using, for example, a wet etch, a dry etch, or a combination of sequential wet and/or dry etches. In some embodiments, the sacrificial spacers 40 are selective to the second bottom spacer 35.

Figure 19:
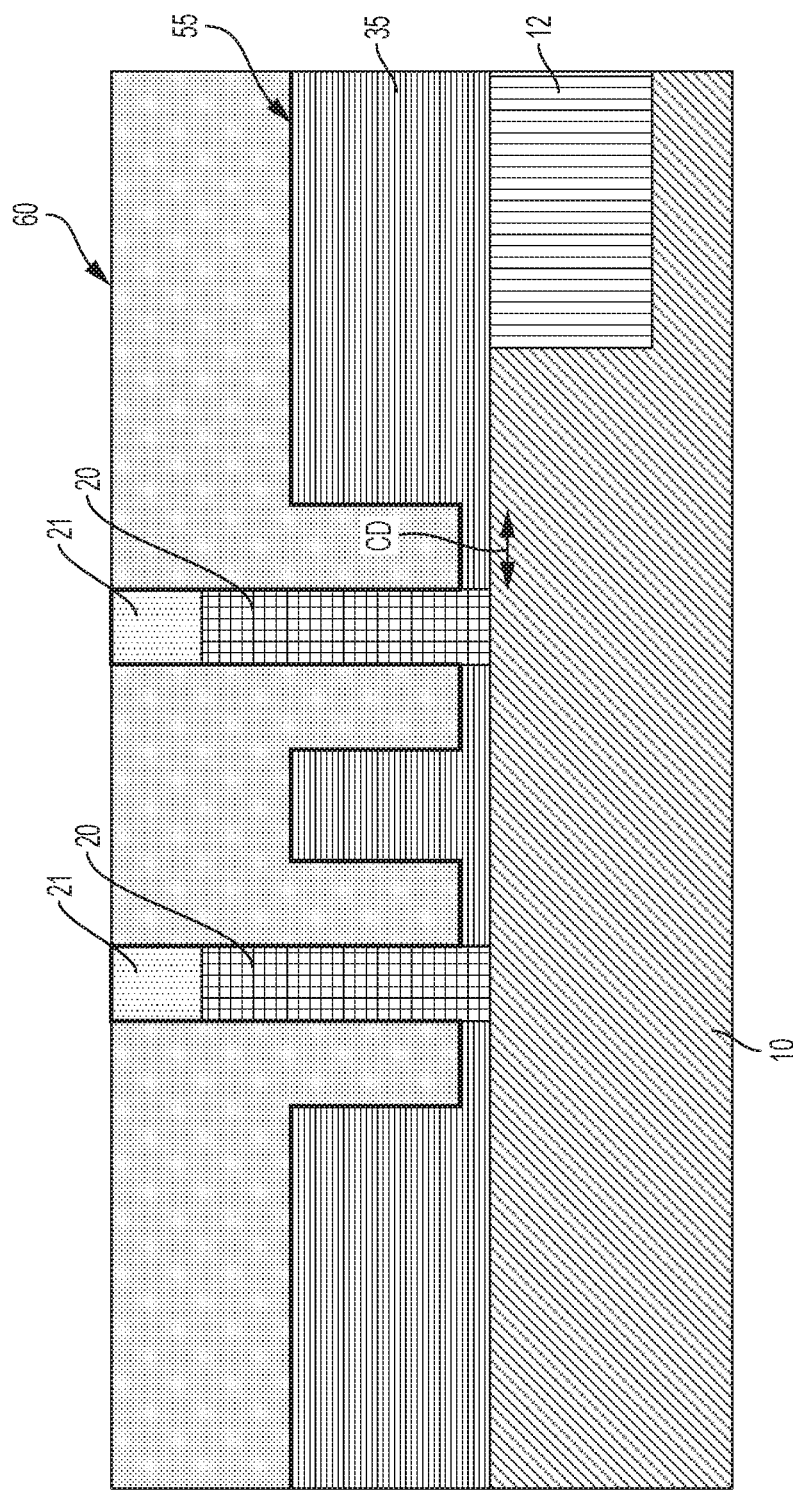
FIG. 19 depicts a cross-sectional view of the semiconductor structure after a processing operation according to one or more embodiments of the present invention.
Figure 20:
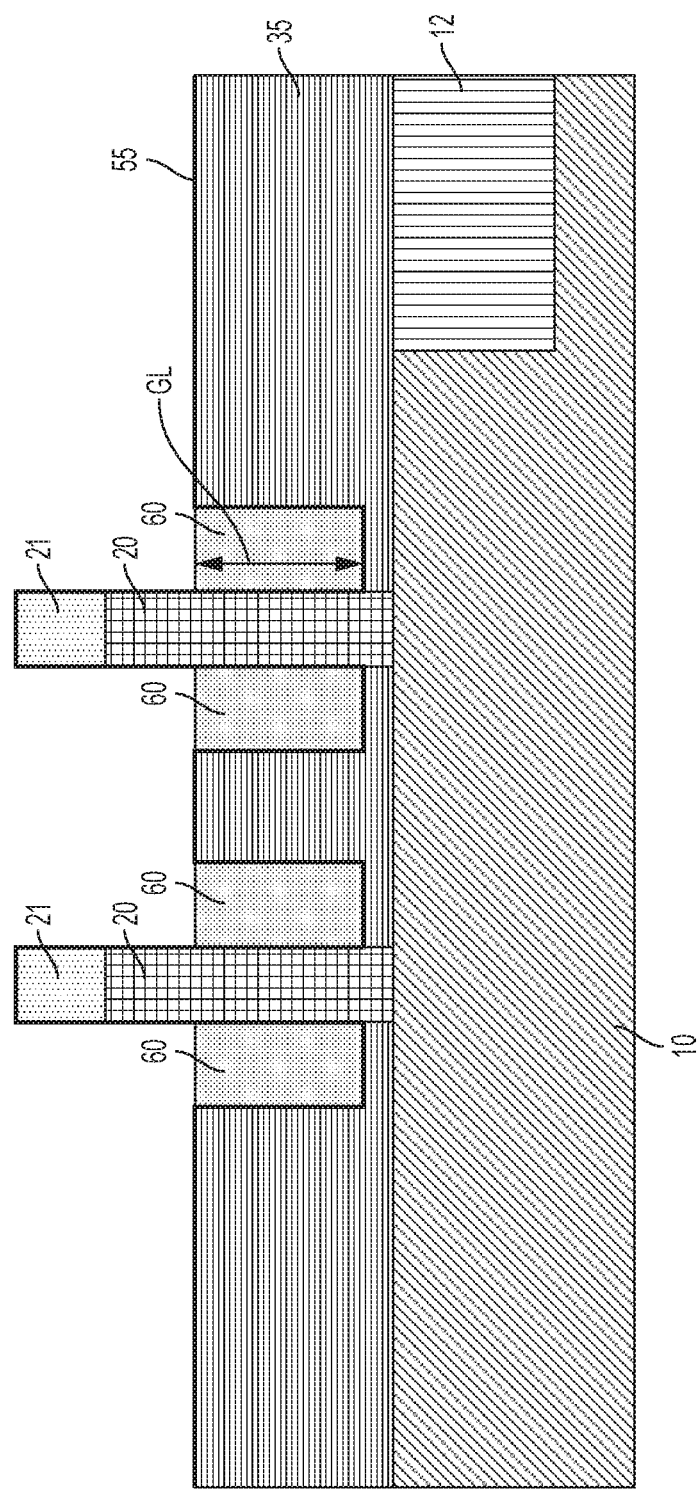
FIG. 20 depicts a cross-sectional view of the semiconductor structure after a processing operation according to one or more embodiments of the present invention.

FIG. 19 depicts a cross-sectional view of a VFET structure after a high dielectric constant gate material deposition during an intermediate operation of the example method of fabricating a semiconductor device according to one or more embodiments of the invention. As depicted in FIG. 19, a high dielectric constant material 55 is deposited over the second bottom spacer 35 and channel regions (i.e., sidewalls) of the semiconductor fins 20. Exemplary high dielectric constant material include, for example, HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, SiON, SiNx, a silicate thereof, and an alloy thereof, where each value of x is independently from 0.5 to 3 and each value of y is independently from 0 to 2.

A conductive gate 60 is formed over the high dielectric constant material 55. In some embodiments, the conductive gate 60 is overfilled above a surface of the hard mask 21. In some embodiments, a CMP selective to the hard mask 21 and/or the high dielectric constant material 55 removes the overburden. The conductive gate 60 can be made of any suitable material in a similar manner as the conductive gate 50 (as depicted in FIG. 5). In some embodiments, the conductive gate 60 includes both a work function metal (WFM) and tungsten. In some embodiments, the critical dimension (CD) of the portion of the conductive gate 60 below a surface of the high dielectric constant material 55 (e.g., the distance from a fin of the semiconductor fins 20 to the second bottom spacer 35 in a same direction in which the semiconductor fins 20 are arranged) is very small (i.e., less than about 10 nm) and is difficult to fully pinch-off while forming the conductive gate 60. In some embodiments, full pinch-off is promoted by forming only WFM in the bottommost region of the conductive gate 60. For example, in some embodiments the critical dimension CD is about 8 nm and the bottommost portion is filled with about 1.5 nm of high dielectric constant material 55 and about 2.5 nm of WFM to ensure full pinch-off.

FIG. 20 depicts a cross-sectional view of a VFET structure after a metal gate recessing during an intermediate operation of the example method of fabricating a semiconductor device according to one or more embodiments of the invention. As depicted in FIG. 20, the conductive gate 60 can be recessed, for example, by a dry etch process. In some embodiments the dry etch process is controlled (i.e., by timing or by selective etching) to ensure that the conductive gate 60 is not recessed below a surface of the second bottom spacer 35. In some embodiments, the etch timing is adjusted to account for RIE lag. In this manner, the gate length GL, e.g., a height of the high dielectric constant material 55 and the conductive gate 60 along a sidewall of the semiconductor fins 20 in a direction orthogonal to the substrate 10, can be accurately controlled. In some embodiments of the invention, the etch rate is progressively slowed as more of the conductive gate 60 is removed.

Figure 21:
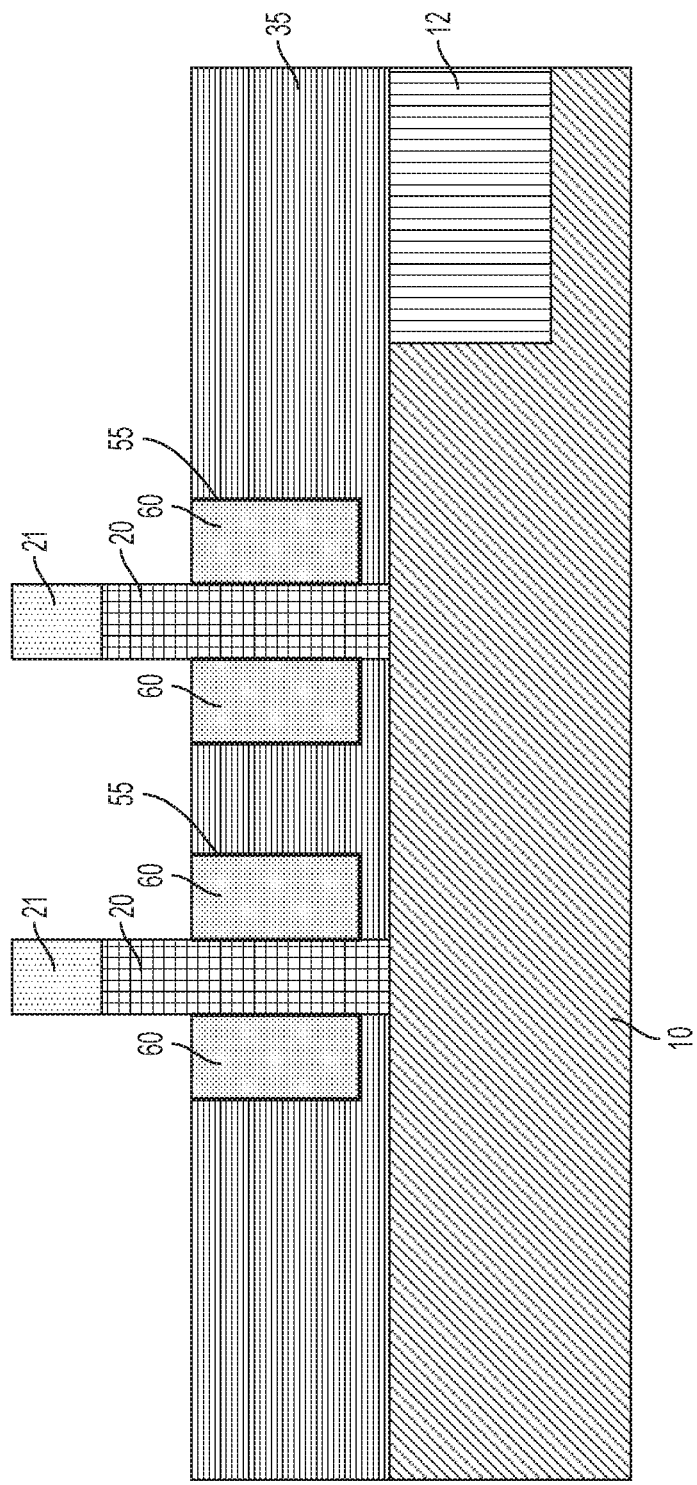
FIG. 21 depicts a cross-sectional view of the semiconductor structure after a processing operation according to one or more embodiments of the present invention.

FIG. 21 depicts a cross-sectional view of a VFET structure after high dielectric constant material removal during an intermediate operation of the example method of fabricating a semiconductor device according to one or more embodiments of the invention. As depicted in FIG. 21, portions of the high dielectric constant material 55 can be removed, for example, by isotropic etching. The isotropic etch can target removal of a thickness equal to that of the high dielectric constant material 55. For example, in some embodiments the high dielectric constant material 55 is HfO2 having a thickness of about 1.5 nm and the isotropic etch targets removal of about 1.5 nm of the high dielectric constant material 55.

Figure 22:
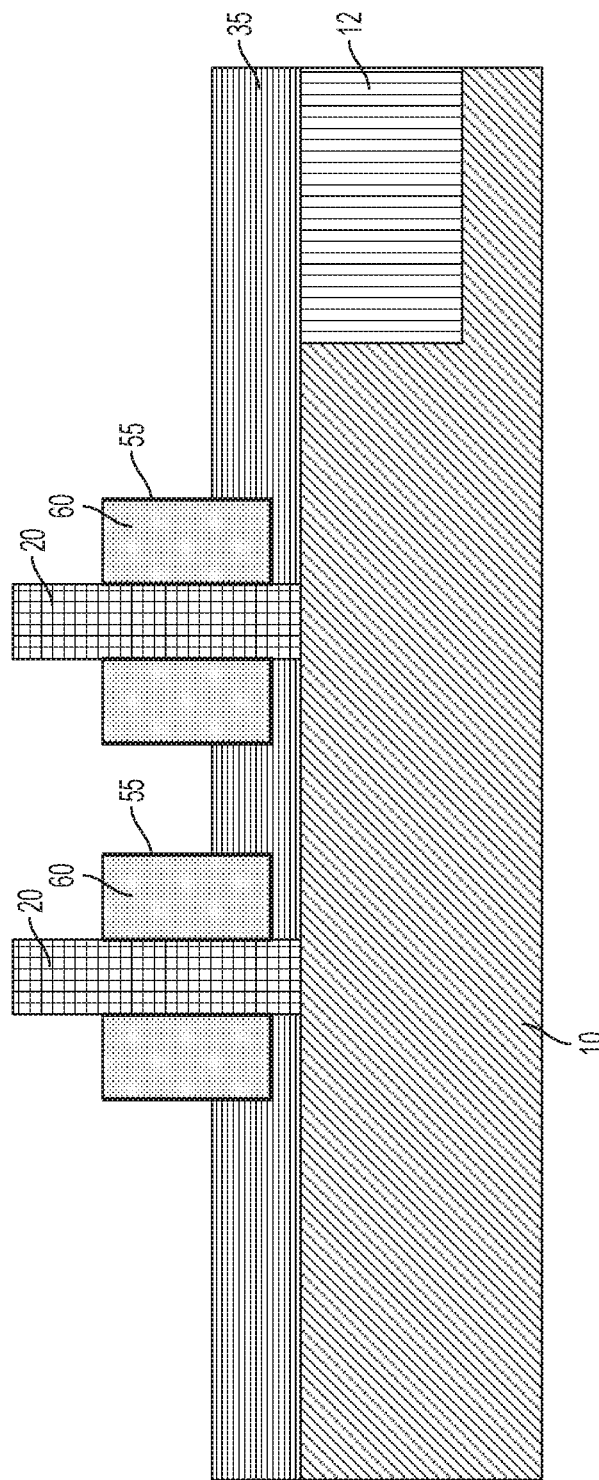
FIG. 22 depicts a cross-sectional view of the semiconductor structure after a processing operation according to one or more embodiments of the present invention.

FIG. 22 depicts a cross-sectional view of a VFET structure after an etch back process during an intermediate operation of the example method of fabricating a semiconductor device according to one or more embodiments of the invention. As depicted in FIG. 22, an etch back process can remove an upper portion of the second bottom spacer 35 and the hard mask 21, exposing portions of the high dielectric constant material 55. The etch back can include a wet etch, a dry etch, or a combination of sequential wet and/or dry etches. In some embodiments, the etch back is selective to the semiconductor fins 20 and/or the conductive gate 60.

Figure 23:
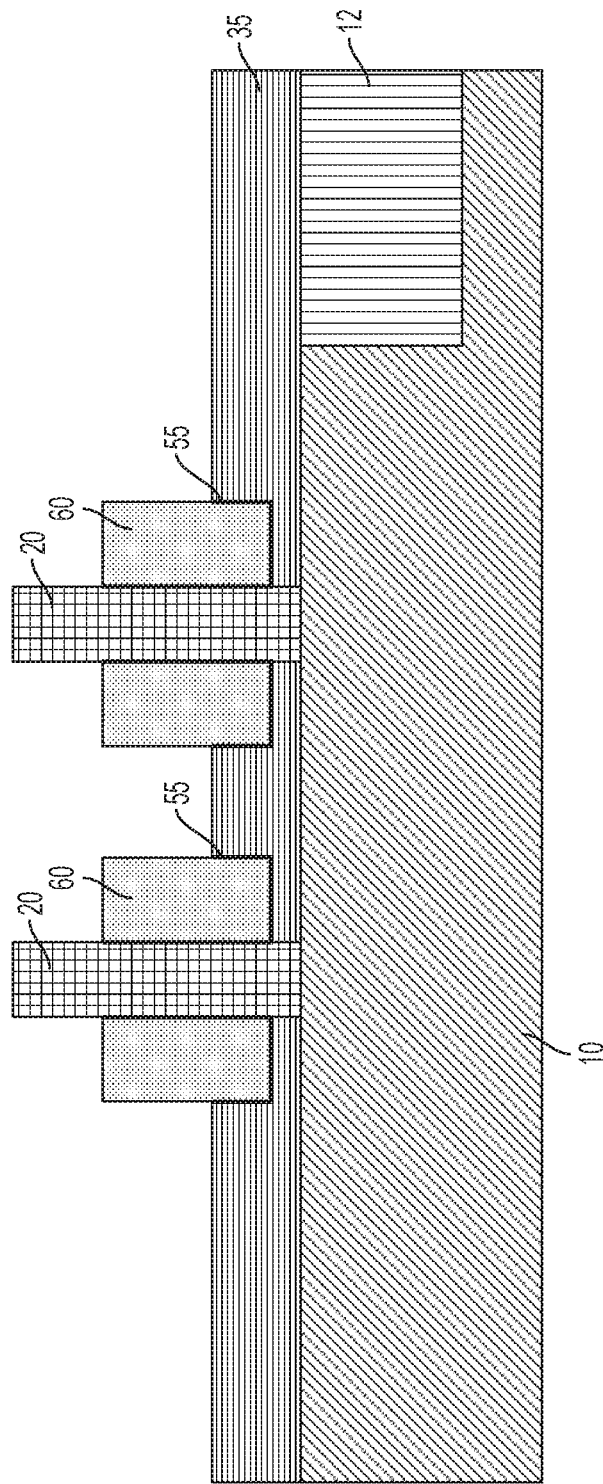
FIG. 23 depicts a cross-sectional view of the semiconductor structure after a processing operation according to one or more embodiments of the present invention.

FIG. 23 depicts a cross-sectional view of a VFET structure after high dielectric constant material removal during an intermediate operation of the example method of fabricating a semiconductor device according to one or more embodiments of the invention. As depicted in FIG. 23, exposed portions of the high dielectric constant material 55 are removed, using, for example, a wet etch, a dry etch, or a combination of sequential wet and/or dry etches. In some embodiments, the exposed portions of the high dielectric constant material 55 are removing using an isotropic etch selective to the conductive gate 60 and/or the second bottom spacer 35.

Figure 24:
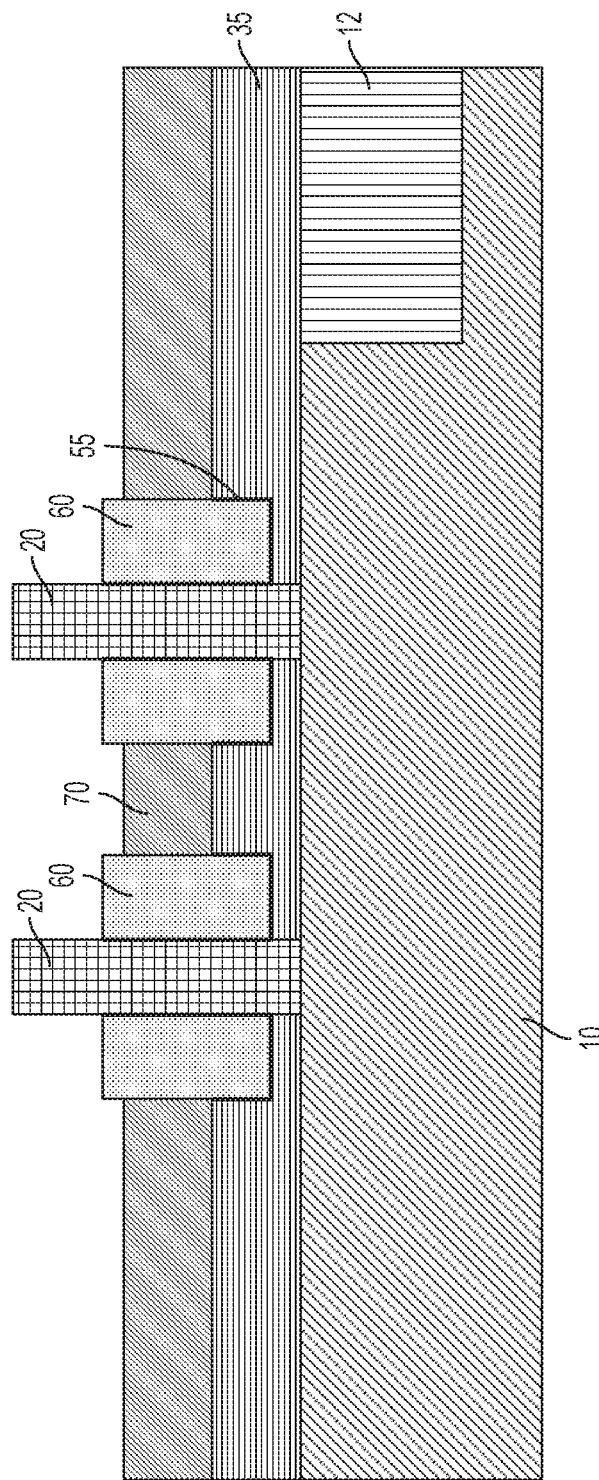
FIG. 24 depicts a cross-sectional view of the semiconductor structure after a processing operation according to one or more embodiments of the present invention.

FIG. 24 depicts a cross-sectional view of a VFET structure after a metal deposition during an intermediate operation of the example method of fabricating a semiconductor device according to one or more embodiments of the invention. As depicted in FIG. 24, a metal layer 70 can be deposited over the second bottom spacer 35. The metal layer 70 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. In some embodiments, the metal layer 70 is a low resistivity metal (having, e.g., a resistivity of less than about 6.5 µΩ·cm) such as, for example, tungsten or cobalt.

Figure 25:
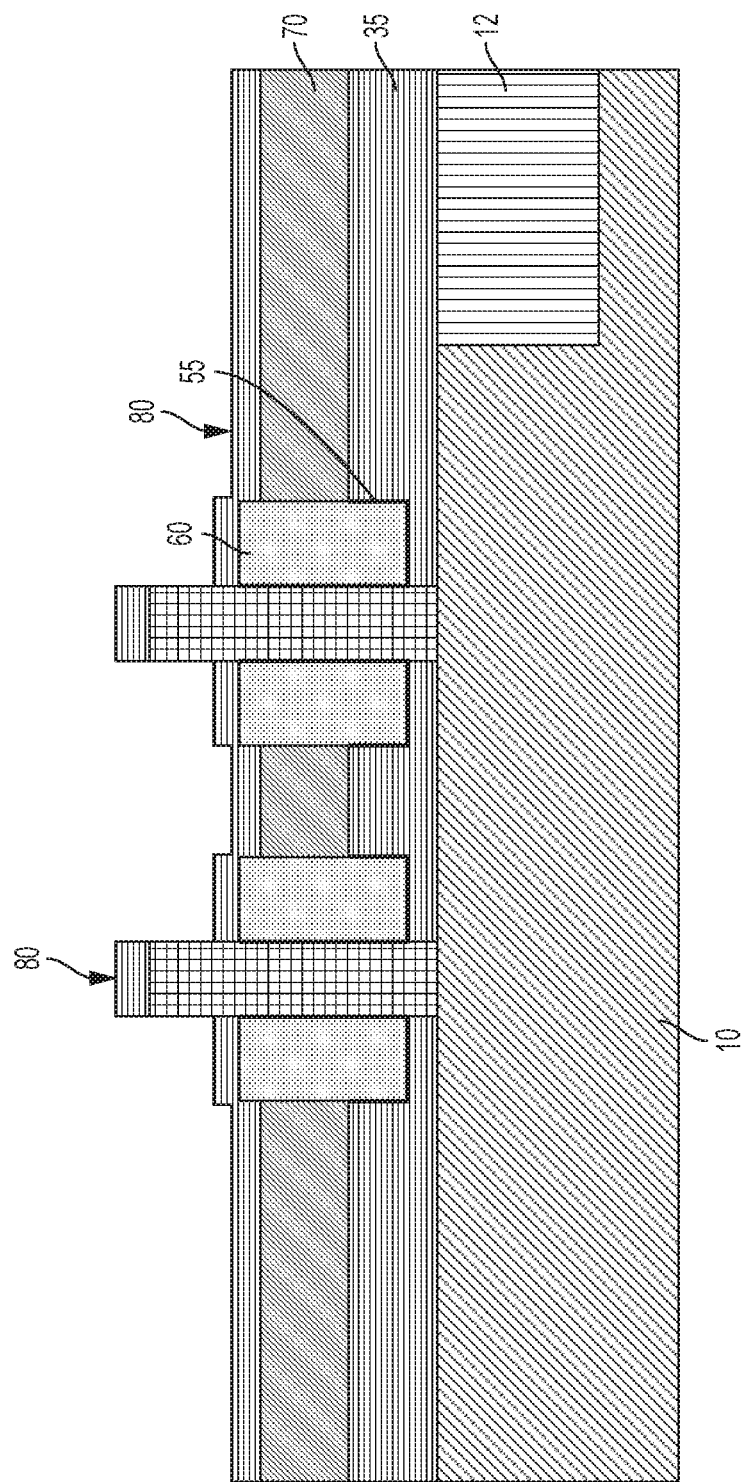
FIG. 25 depicts a cross-sectional view of the semiconductor structure after a processing operation according to one or more embodiments of the present invention.
Figure 28:
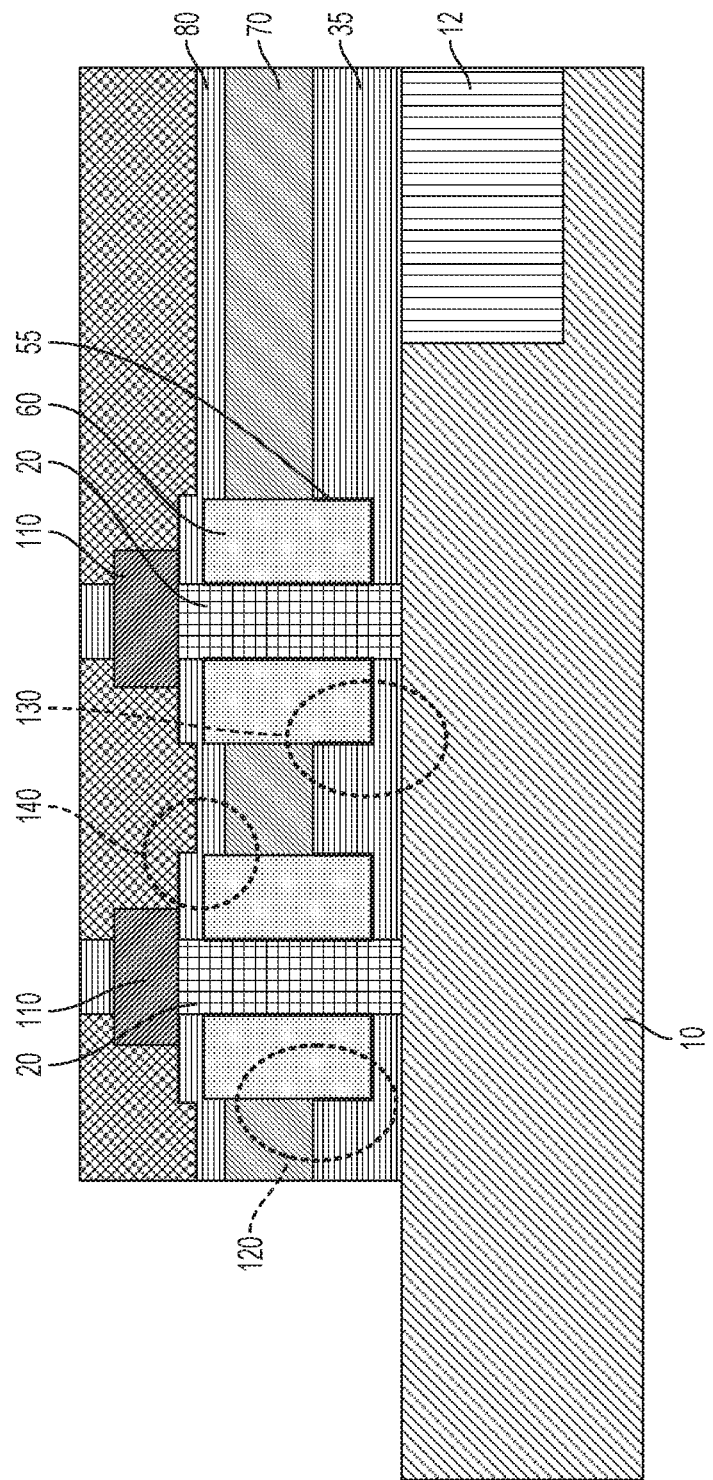
FIG. 28 depicts a cross-sectional view of the semiconductor structure after a processing operation according to one or more embodiments of the present invention.

In some embodiments, the metal layer 70 is overfilled above a surface of the conductive gate 60. In some embodiments, a CMP selective to the conductive gate 60 removes the overburden. In some embodiments, a wet or dry etch recesses the metal layer 70 below a surface of the conductive gate 60. Consequently, a stepped gate structure is provided (as depicted in FIG. 28) and a stepped top spacer 80 can be formed (as depicted in FIG. 25). Forming a stepped gate and a stepped top spacer in this manner further reduces parasitic capacitance without degrading device performance by reducing the amount of conductive material relative to dielectric material in non-channel regions of the VFET structure without reducing the amount of conductive materials in the channel regions.

FIG. 25 depicts a cross-sectional view of a VFET structure after top spacer formation during an intermediate operation of the example method of fabricating a semiconductor device according to one or more embodiments of the invention. As depicted in FIG. 25, a top spacer 80 is formed on upper surfaces of the semiconductor fins 20, the conductive gate 60, and the metal layer 70. The top spacer 80 can include a dielectric material, such as silicon oxide, silicon nitride, silicon oxynitride, or a combination thereof, and can be formed using a deposition process such as, for example, GCIB, in a similar manner as the first bottom spacer 30 (as depicted in FIG. 13). In some embodiments, the top spacer 80 is conformally formed to a thickness of about 5 nm to about 50 nm, although other thicknesses are within the contemplated scope of the invention.

Figure 26:
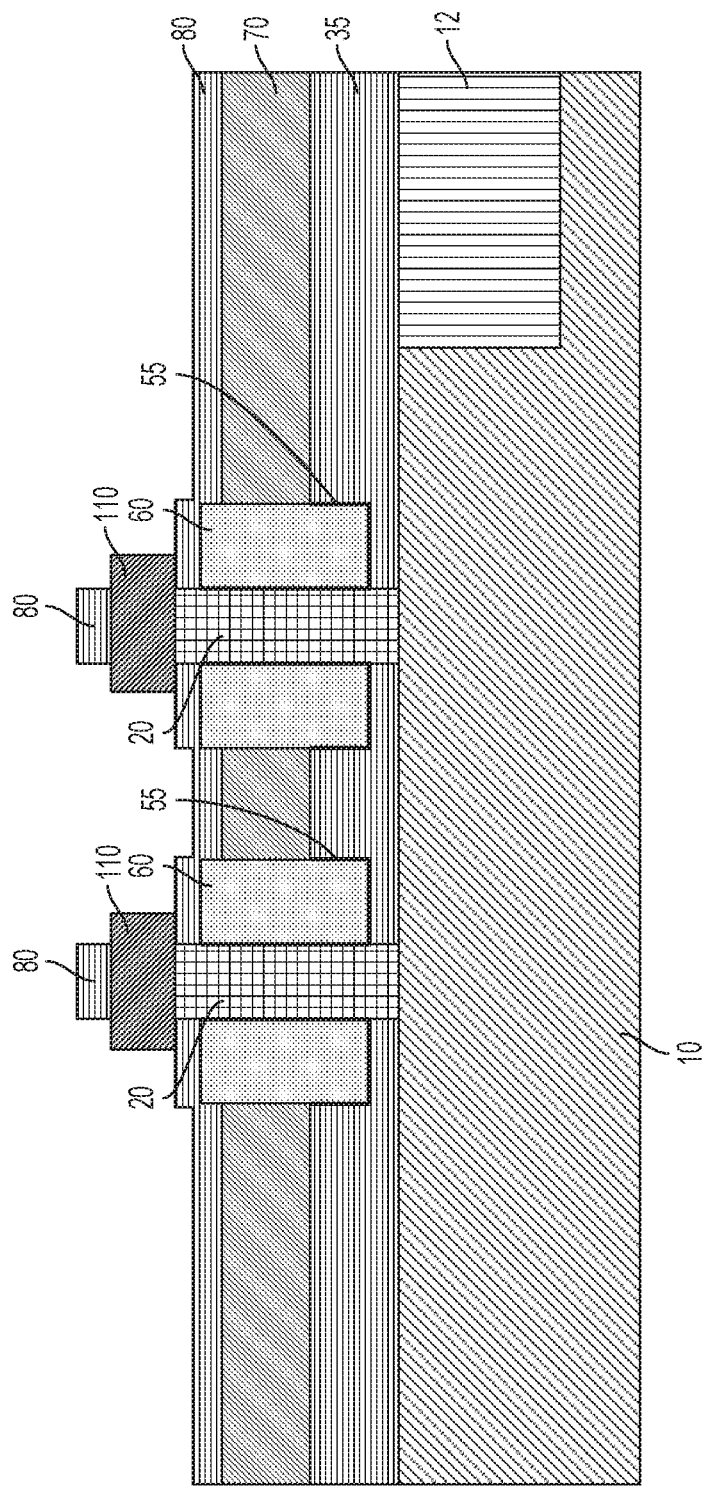
FIG. 26 depicts a cross-sectional view of the semiconductor structure after a processing operation according to one or more embodiments of the present invention.

FIG. 26 depicts a cross-sectional view of a VFET structure after top drain formation during an intermediate operation of the example method of fabricating a semiconductor device according to one or more embodiments of the invention. As depicted in FIG. 26, a top S/D 110 can be formed on the semiconductor fins 20. The top S/D 110 can be epitaxially grown using known processes, as discussed previously herein. The dopant concentration in the S/D 110 can range from about $1 \times 10^{19}$ cm$^{-3}$ to about $2 \times 10^{21}$ cm$^{-3}$, or between about $2 \times 10^{20}$ cm$^{-3}$ and about $1 \times 10^{21}$ cm$^{-3}$.

Figure 27:
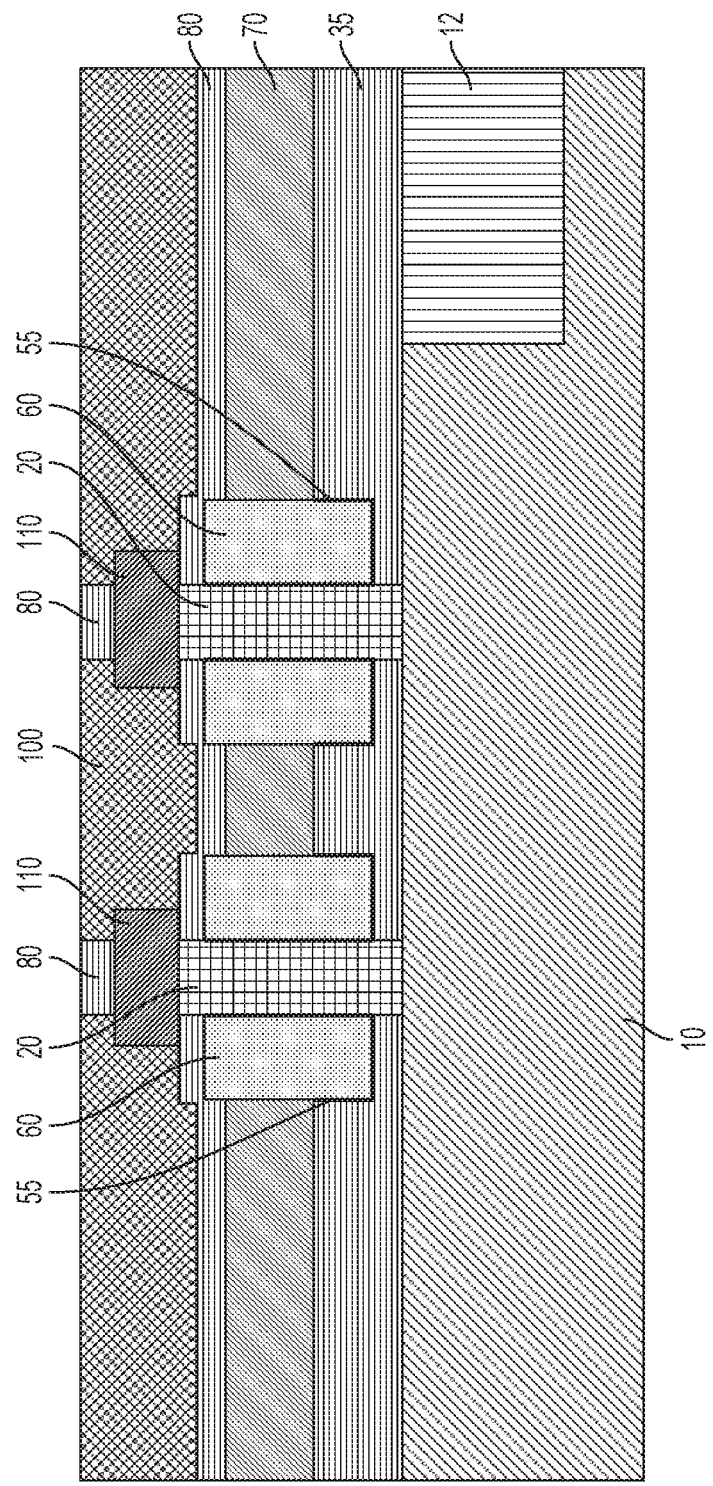
FIG. 27 depicts a cross-sectional view of the semiconductor structure after a processing operation according to one or more embodiments of the present invention.

FIG. 27 depicts a cross-sectional view of a VFET structure after ILD formation during an intermediate operation of the example method of fabricating a semiconductor device according to one or more embodiments of the invention. As depicted in FIG. 27, an ILD 100 fill can be performed. The ILD 100 can be any suitable dielectric, as discussed previously herein. In some embodiments, the ILD 100 is overfilled above a surface of the top spacer 80. In some embodiments, a CMP selective to the top spacer 80 removes the overburden such that the upper surface of ILD 100 is coplanar with the upper surfaces of top spacer 80.

FIG. 28 depicts a cross-sectional view of a VFET structure after patterning the structure to expose a portion of the substrate 10 during an intermediate operation of the example method of fabricating a semiconductor device according to one or more embodiments of the invention. The structure can be patterned using, for example, RIE. In some embodiments, the RIE is selective to the substrate 10. The resulting structure includes a stepped bottom spacer 130, a stepped metal gate 120 and a stepped top spacer 140, as discussed previously herein.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a semiconductor fin on a substrate;
    forming a stepped bottom spacer on a surface of the substrate, the stepped bottom spacer comprising a first portion having a first thickness and a second portion having a second thickness greater than the first thickness, the first portion defining a near-channel region and the second portion defining a non-channel region;
    forming a stepped gate over a channel region of the semiconductor fin, the stepped gate comprising a first portion positioned on the near-channel region of the stepped bottom spacer and a second portion positioned on the non-channel region of the stepped bottom spacer; and
    forming a stepped top spacer on the stepped gate.

2. The method of claim 1, wherein the near-channel region of the stepped bottom spacer is positioned between the non-channel region of the stepped bottom spacer and a sidewall of the semiconductor fin.

3. The method of claim 1 further comprising forming a second semiconductor fin on the substrate.

4. The method of claim 1, wherein the stepped bottom spacer comprises a dielectric material selected from the group consisting of silicon oxide, silicon nitride, silicon oxynitride, and combinations thereof.

5. The method of claim 1, wherein forming the stepped gate comprises depositing a first conductive material over the stepped bottom spacer.

6. The method of claim 5, wherein forming the stepped gate further comprises recessing the first conductive material such that the first conductive material is confined to a trench positioned over the near-channel region of the stepped bottom spacer.

7. The method of claim 6, wherein forming the stepped gate further comprises recessing the non-channel region of the stepped bottom spacer to expose a sidewall of the first conductive material.

8. The method of claim 7, wherein forming the stepped gate further comprises depositing a second conductive material on the recessed surface of the non-channel region of the stepped bottom spacer.

9. The method of claim 8, wherein the stepped top spacer is formed on the first conductive material and the second conductive material.

10. A semiconductor device comprising:
    a semiconductor fin on a substrate;
    a stepped bottom spacer on a surface of the substrate, the stepped bottom spacer comprising a near-channel region and a non-channel region, wherein the near-channel region comprises a greater thickness than the non-channel region;
    a stepped gate over a channel region of the semiconductor fin, the stepped gate comprising a first portion positioned on the near-channel region of the stepped bottom spacer and a second portion positioned on the non-channel region of the stepped bottom spacer; and
    a stepped top spacer on the stepped gate.

11. The semiconductor device of claim 10, wherein the near-channel region of the stepped bottom spacer is positioned between the non-channel region of the stepped bottom spacer and a sidewall of the semiconductor fin.

12. The semiconductor device of claim 10 further comprising a second semiconductor fin on the substrate.

13. The semiconductor device of claim 10, wherein the stepped bottom spacer comprises a dielectric material selected from the group consisting of silicon oxide, silicon nitride, silicon oxynitride, and combinations thereof.

* * * * *